US011476247B2

(12) United States Patent
Yamaguchi et al.

(10) Patent No.: US 11,476,247 B2
(45) Date of Patent: Oct. 18, 2022

(54) SEMICONDUCTOR RECTIFIER

(71) Applicant: ROHM CO., LTD., Kyoto (JP)

(72) Inventors: Atsushi Yamaguchi, Kyoto (JP); Junichi Kashiwagi, Kyoto (JP); Yohei Moriyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 3 days.

(21) Appl. No.: 16/767,428

(22) PCT Filed: Nov. 26, 2018

(86) PCT No.: PCT/JP2018/043398
§ 371 (c)(1),
(2) Date: May 27, 2020

(87) PCT Pub. No.: WO2019/116868
PCT Pub. Date: Jun. 20, 2019

(65) Prior Publication Data
US 2020/0388610 A1    Dec. 10, 2020

(30) Foreign Application Priority Data

Dec. 11, 2017 (JP) .............................. JP2017-236708

(51) Int. Cl.
*H01L 27/06* (2006.01)
*H01L 29/16* (2006.01)
(Continued)

(52) U.S. Cl.
CPC ...... *H01L 27/0629* (2013.01); *H01L 29/1608* (2013.01); *H01L 29/2003* (2013.01); *H01L 29/872* (2013.01); *H02M 7/12* (2013.01)

(58) Field of Classification Search
CPC ............. H01L 27/0629; H01L 29/1608; H01L 29/2003; H01L 29/872; H02M 7/12
See application file for complete search history.

(56) References Cited

U.S. PATENT DOCUMENTS

2013/0154391 A1\* 6/2013 Urciuoli .................. H02M 1/32
307/112
2013/0341641 A1\* 12/2013 Nishiwaki ........... H01L 27/0727
257/77
(Continued)

FOREIGN PATENT DOCUMENTS

JP   52-143779 A   11/1977
JP   1-51664 A    2/1989
(Continued)

OTHER PUBLICATIONS

International Search Report issued in PCT/JP2018/043398, dated Feb. 5, 2019 (1 page).
(Continued)

*Primary Examiner* — Fernando L Toledo
*Assistant Examiner* — Neil R Prasad
(74) *Attorney, Agent, or Firm* — Hamre, Schumann, Mueller & Larson, P.C.

(57) ABSTRACT

A semiconductor rectifier includes a transistor and a diode. The transistor includes a source electrode, a drain electrode and a gate electrode. The diode includes an anode electrode and a cathode electrode. The anode electrode is electrically connected to the gate electrode, and the cathode electrode is electrically connected to the source electrode.

15 Claims, 27 Drawing Sheets

(51) Int. Cl.
  *H01L 29/20* (2006.01)
  *H01L 29/872* (2006.01)
  *H02M 7/12* (2006.01)

(56) References Cited

U.S. PATENT DOCUMENTS

| | | | |
|---|---|---|---|
| 2015/0372585 A1* | 12/2015 | Kutschak | H02M 1/36 363/21.12 |
| 2018/0034446 A1* | 2/2018 | Wood | H02M 5/458 |
| 2019/0035844 A1* | 1/2019 | Liu | H01L 29/2003 |

FOREIGN PATENT DOCUMENTS

| | | | |
|---|---|---|---|
| JP | 2016-134435 A | 7/2016 | |
| JP | 2017-120878 A | 7/2017 | |

OTHER PUBLICATIONS

Office Action received in the corresponding Japanese Patent application, dated Aug. 9, 2022, and machine translation (10 pages).

\* cited by examiner

SEMICONDUCTOR RECTIFIER

TECHNICAL FIELD

The present disclosure relates to a semiconductor rectifier.

BACKGROUND ART

A Schottky barrier diode, which is a type of semiconductor rectifier, includes a silicon semiconductor layer, a Schottky electrode, and an ohmic electrode.

SUMMARY OF THE INVENTION

In an aspect, the present disclosure provides a semiconductor rectifier including a transistor and a diode. The transistor includes a source electrode, a drain electrode and a gate electrode. The diode includes an anode electrode and a cathode electrode. The anode electrode is electrically connected to the gate electrode, and the cathode electrode is electrically connected to the source electrode.

MODE FOR CARRYING OUT THE INVENTION

Hereafter, exemplary embodiments of the present disclosure will be described with reference to the drawings.

First Embodiment

FIG. 1 to FIG. 4 illustrate a semiconductor rectifier according to a first embodiment of the present disclosure. The semiconductor rectifier A1 according to this embodiment includes a transistor 1, a diode 2, a lead frame 3, and a sealing resin 6.

Figure 1:
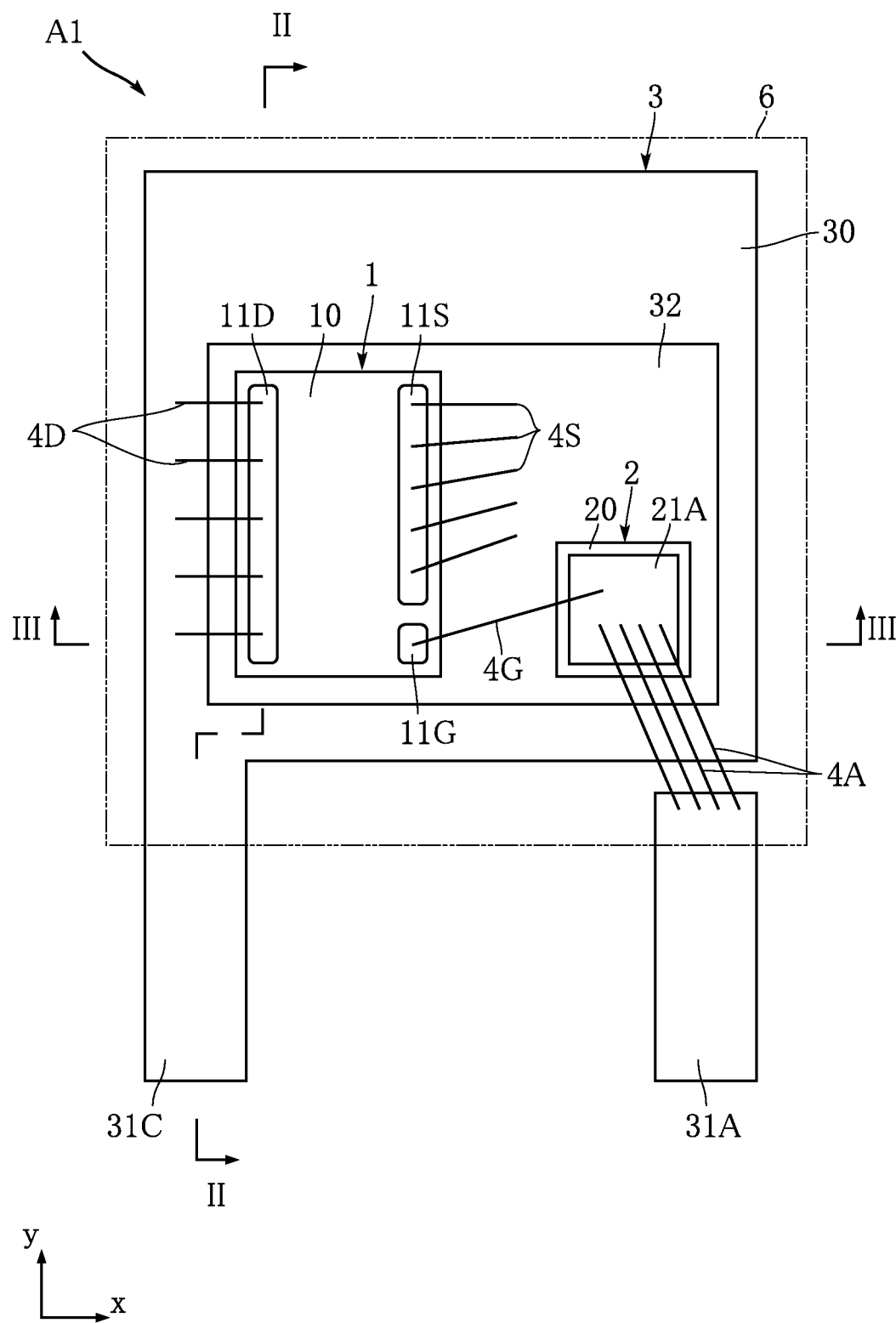
FIG. 1 is a plan view showing a semiconductor rectifier according to a first embodiment of the present disclosure.
Figure 2:
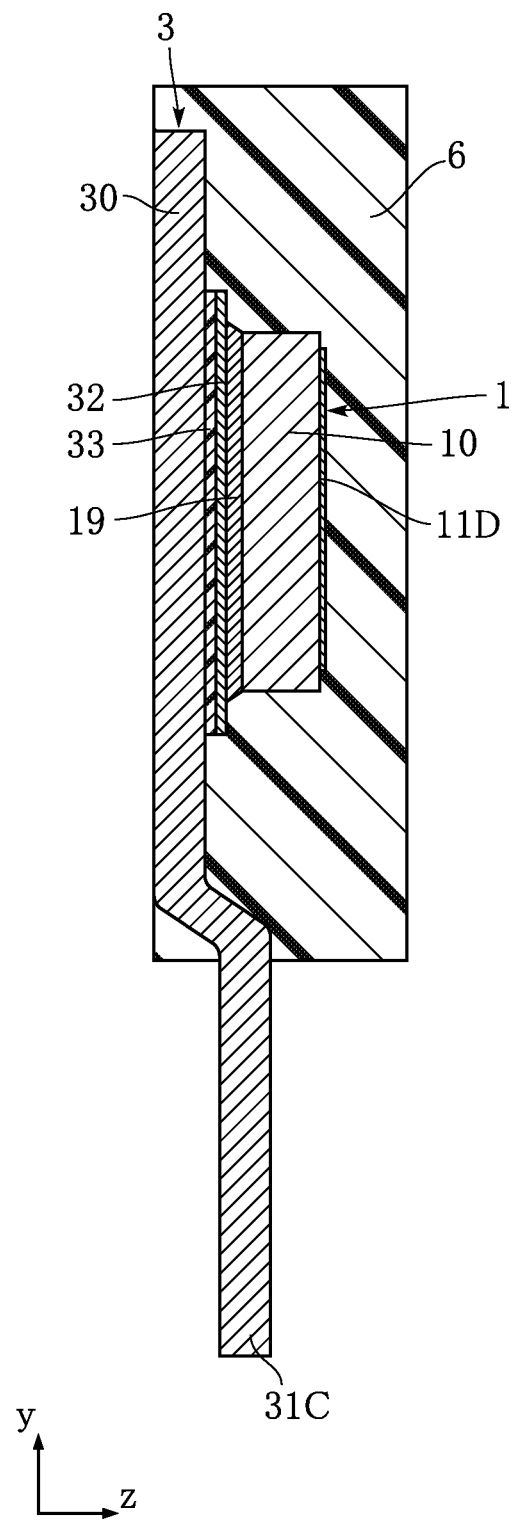
FIG. 2 is a cross-sectional view taken along a line II-II in FIG. 1.
Figure 3:
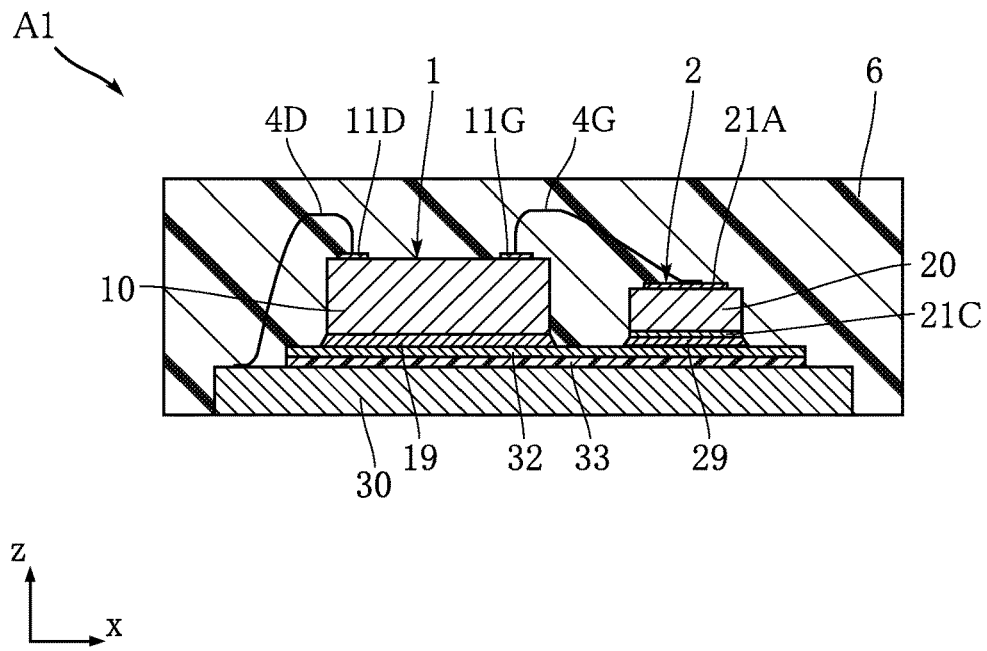
FIG. 3 is a cross-sectional view taken along a line III-III in FIG. 1.
Figure 4:
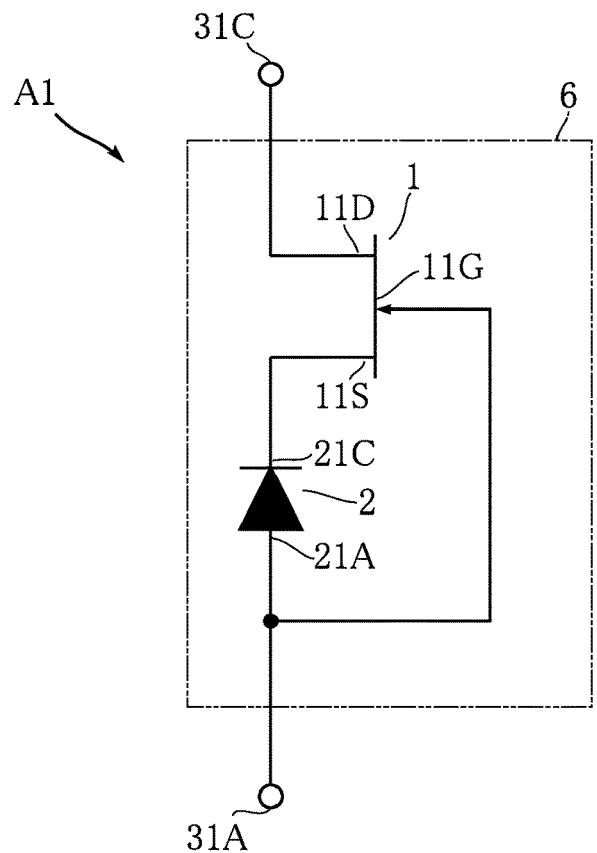
FIG. 4 is a circuit diagram of the semiconductor rectifier according to the first embodiment of the present disclosure.

FIG. 1 is a plan view showing the semiconductor rectifier A1. FIG. 2 is a cross-sectional view taken along a line II-II in FIG. 1. FIG. 3 is a cross-sectional view taken along a line III-III in FIG. 1. FIG. 4 is a circuit diagram of the semiconductor rectifier A1.

The transistor 1 is, for example, a normally-on transistor (depletion type), and includes a main body 10, a source electrode 11S, a drain electrode 11D, and a gate electrode 11G.

The main body 10 includes a semiconductor layer and, in this embodiment, includes a GaN semiconductor layer. In this case, the transistor 1 may be, for example, a GaN-MOSFET or a GaN-HEMT. The source electrode 11S, the drain electrode 11D, and the gate electrode 11G are located on the upper face of the main body 10, in other words on the same face of the main body 10.

The source electrode 11S, the drain electrode 11D, and the gate electrode 11G are made of a metal and formed by plating, for example. From the viewpoint of the quality of wire bonding and solder bonding, it is preferable that the respective surface layers of the source electrode 11S, the drain electrode 11D, and the gate electrode 11G include Au. The respective portions of the source electrode 11S, the drain electrode 11D, and the gate electrode 11G covered with the surface layer are, for example, formed of a metal such as Cu or Ni.

The diode 2 includes a main body 20, an anode electrode 21A and a cathode electrode 21C. The diode 2 is, for example, a Si-Schottky barrier diode, in which the main body 20 includes a Si semiconductor layer. Preferably, the threshold voltage of the diode 2 is equal to or lower than 0.8 V.

The lead frame 3 supports the transistor 1 and the diode 2, and constitutes an electrical conduction path to the transistor 1 and the diode 2. In this embodiment, the lead frame 3 includes an island portion 30, an anode terminal 31A, and a cathode terminal 31C. The lead frame 3 also includes a metal layer 32 and an insulation layer 33.

The material of the lead frame 3 is not particularly limited. The lead frame 3 may be formed, for example, by punching or bending a metal sheet material of Cu or Ni.

The island portion 30 supports the transistor 1 and the diode 2. In the illustrated example, the island portion 30 has a rectangular shape in a plan view, having four sides extending along an x-direction or a y-direction. However, the shape of the island portion 30 is not particularly limited.

In this embodiment, the island portion 30 includes a metal layer 32. The metal layer 32 is formed of a metal appropriately selected from, for example, Al, Cu, or Ni, or an alloy of the cited metals. In the illustrated example, the metal layer 32 is fixed to the island portion 30, via an insulation layer 33. The insulation layer 33 is formed of an insulative material, such as a resin or a ceramic. The metal layer 32 is smaller than the island portion 30, when viewed in the z-direction. The formation method of the metal layer 32 is not particularly limited. For example, the metal layer 32 may be formed on the insulation layer 33 by plating, or the metal layer 32 formed in advance may be bonded to the island portion 30, via the insulation layer 33.

In the illustrated example, the transistor 1 is bonded to the metal layer 32, via a bonding layer 19. The cathode electrode 21C of the diode 2 is bonded to the metal layer 32, via a bonding layer 29. In this embodiment, the bonding layer 19 may be either insulative or conductive. The bonding layer 29 is formed of a conductive material, such as solder. Accordingly, the cathode electrode 21C of the diode 2 is electrically connected to the metal layer 32.

The anode terminal 31A serves as a terminal of the semiconductor rectifier A1, and is connected to the anode. The anode terminal 31A is spaced apart from the island portion 30.

The cathode terminal 31C serves as a terminal of the semiconductor rectifier A1, and is connected to the cathode. In this embodiment, the cathode terminal 31C is connected to the island portion 30.

In the illustrated example, the semiconductor rectifier A1 includes a plurality of anode wires 4A, a gate wire 4G, a plurality of source wires 4S, and a plurality of drain wires 4D. The anode wires 4A are connected between the anode terminal 31A and the anode electrode 21A of the diode 2. The gate wire 4G is connected between the anode electrode 21A of the diode 2 and the gate electrode 11G of the transistor 1. The source wires 4S are connected between the metal layer 32 and the source electrode 11S of the transistor 1. The drain wires 4D are connected between the drain electrode 11D of the transistor 1 and the island portion 30.

The anode wires 4A, the gate wire 4G, the source wires 4S, and the drain wires 4D are, for example, formed of a metal such as Au, Al, or Cu. In the following description it will be assumed that the anode wires 4A, the gate wire 4G, the source wires 4S and the drain wires 4D are formed of Au. The number of each kind of wires mentioned above may vary and be determined depending on the material.

Due to the configurations noted above, the circuit of the semiconductor rectifier A1 may be illustrated as in FIG. 4. The anode electrode 21A of the diode 2 is electrically connected to the gate electrode 11G, via the gate wire 4G. The cathode electrode 21C of the diode 2 is electrically connected to the source electrode 11S, via the metal layer 32 and the source wires 4S.

The sealing resin 6 serves to protect the transistor 1, the diode 2, a part of the lead frame 3, the anode wires 4A, the gate wire 4G, the source wires 4S, and the drain wires 4D. The sealing resin 6 is formed of an insulative resin such as an epoxy resin. In the illustrated example, the bottom face of the island portion 30 is exposed from the sealing resin 6. The anode terminal 31A and the cathode terminal 31C protrude out in the same direction from a side face of the sealing resin 6.

The semiconductor rectifier A1 provides the following advantageous effects.

Figure 5:
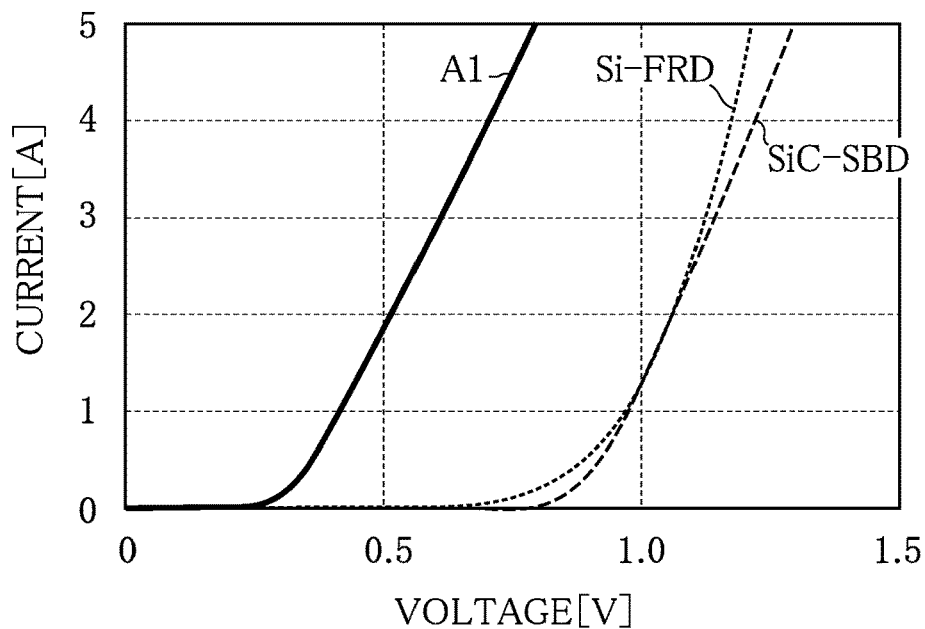
FIG. 5 is a graph showing voltage-current characteristics of the semiconductor rectifier according to the first embodiment of the present disclosure.
Figure 6:
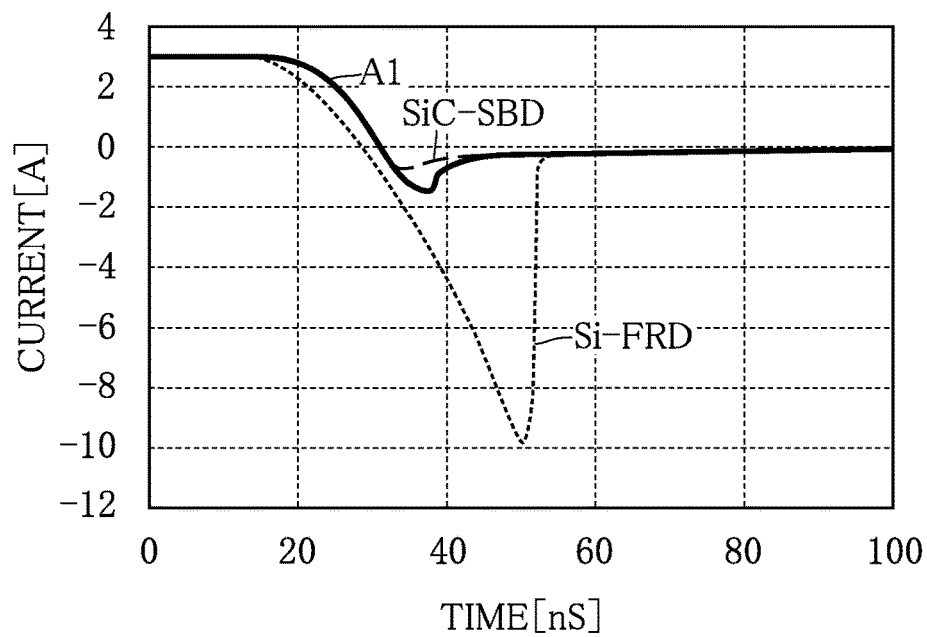
FIG. 6 is a graph showing reverse recovery characteristics of the semiconductor rectifier according to the first embodiment of the present disclosure.

According to the present embodiment, the use of transistor 1 contributes to improving the withstand voltage, compared with, for example, a semiconductor rectifier constituted of a single diode. FIG. 5 shows a relation between the voltage and the current applied between the anode terminal 31A and the cathode terminal 31C, together with other relations between the voltage and the current in a semiconductor rectifier with a single fast recovery diode (Si-FRD), and in a semiconductor rectifier with a single Schottky barrier diode (SiC-SBD) for comparison with the semiconductor rectifier A1. As shown in FIG. 5, the threshold voltage at which a predetermined current starts to run in the semiconductor rectifier A1 is lower than the threshold voltage of the semiconductor rectifier including the single Si-FRD and the semiconductor rectifier including the single SiC-SBD. FIG. 6 indicates reverse recovery characteristics of the semiconductor rectifier A1, and also the semiconductor rectifier including the single Si-FRD and the semiconductor rectifier including the single SiC-SBD, as comparative examples. Focusing on the reverse recovery time, during which the current runs in the reverse direction when the semiconductor rectifier is turned off from anon state, the reverse recovery time of the semiconductor rectifier A1 is similar to that of the semiconductor rectifier including the single SiC-SBD, but significantly shorter than that of the semiconductor rectifier including the single Si-FRD. Therefore, the semiconductor rectifier A1 contributes to improving the withstand voltage, reducing the threshold voltage, and shortening the reverse recovery time.

FIG. 7 to FIG. 31 illustrate variations and other embodiments of the present disclosure. In these drawings, the elements same as or similar to those of the foregoing embodiment are given the same numeral.

First Variation of First Embodiment

Figure 7:
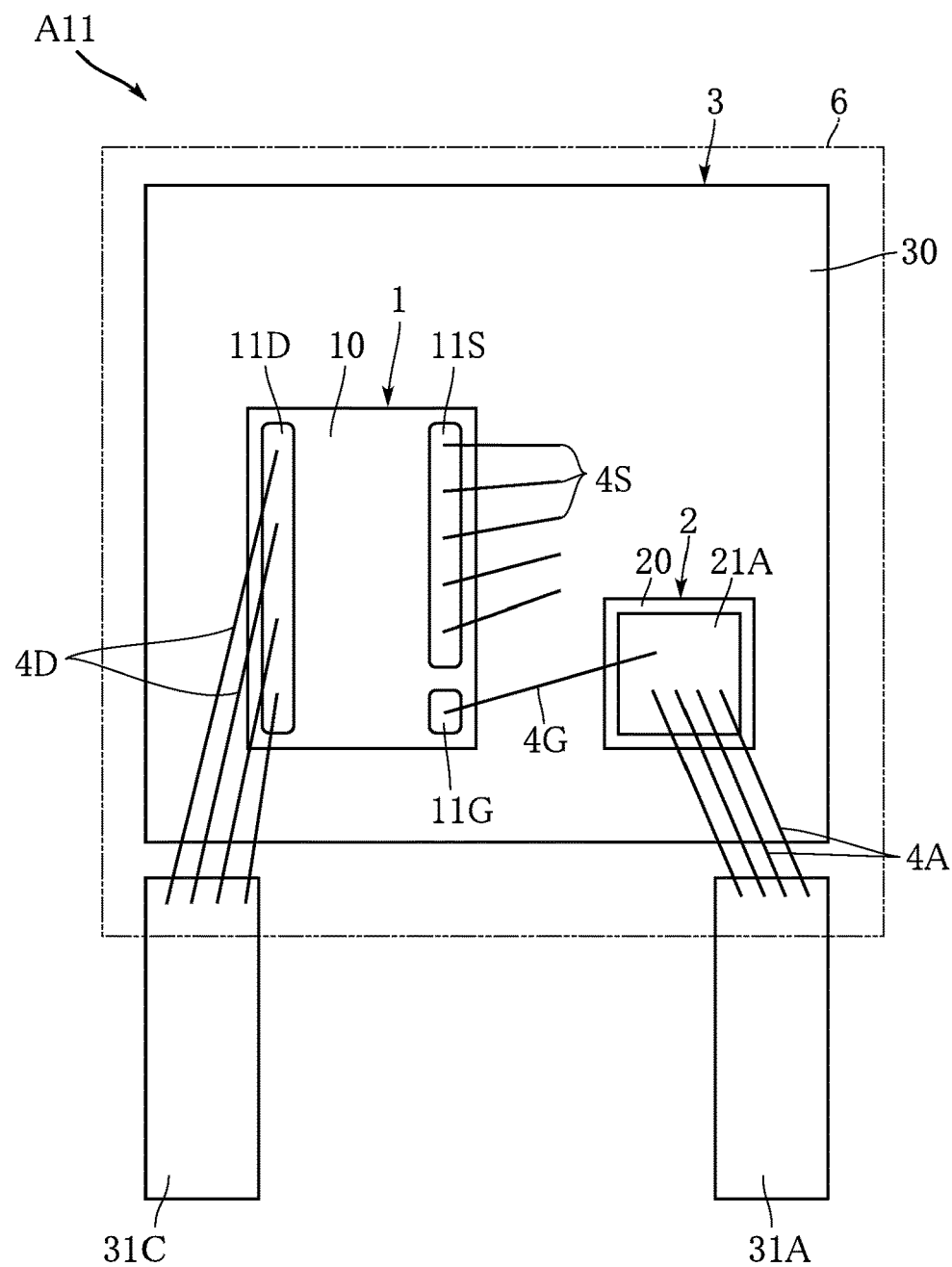
FIG. 7 is a plan view showing a first variation of the semiconductor rectifier according to the first embodiment of the present disclosure.

FIG. 7 illustrates a first variation of the semiconductor rectifier A1. A semiconductor rectifier A11 according to this variation is different from the semiconductor rectifier A1, in the configuration of the lead frame 3. In this variation, the metal layer 32 and the insulation layer 33 are not provided on the island portion 30. The main body 10 of the transistor 1 is bonded to the island portion 30 via the bonding layer 19, and the cathode electrode 21C of the diode 2 is bonded to the island portion 30, via the bonding layer 29. Therefore, the island portion 30 is equipotential with the cathode electrode 21C. Accordingly, the cathode terminal 31C is spaced apart from the island portion 30. The drain wires 4D are connected between the drain electrode 11D of the transistor 1 and the cathode terminal 31C. The island portion 30 may be either partially exposed from the sealing resin 6, or entirely covered with the sealing resin 6.

With the configuration according to this variation also, the withstand voltage can be improved, the threshold voltage can be lowered, and the reverse recovery time can be shortened. In addition, since the metal layer 32 and the insulation layer 33 are excluded, the manufacturing cost can be reduced.

Second Variation of First Embodiment

Figure 8:
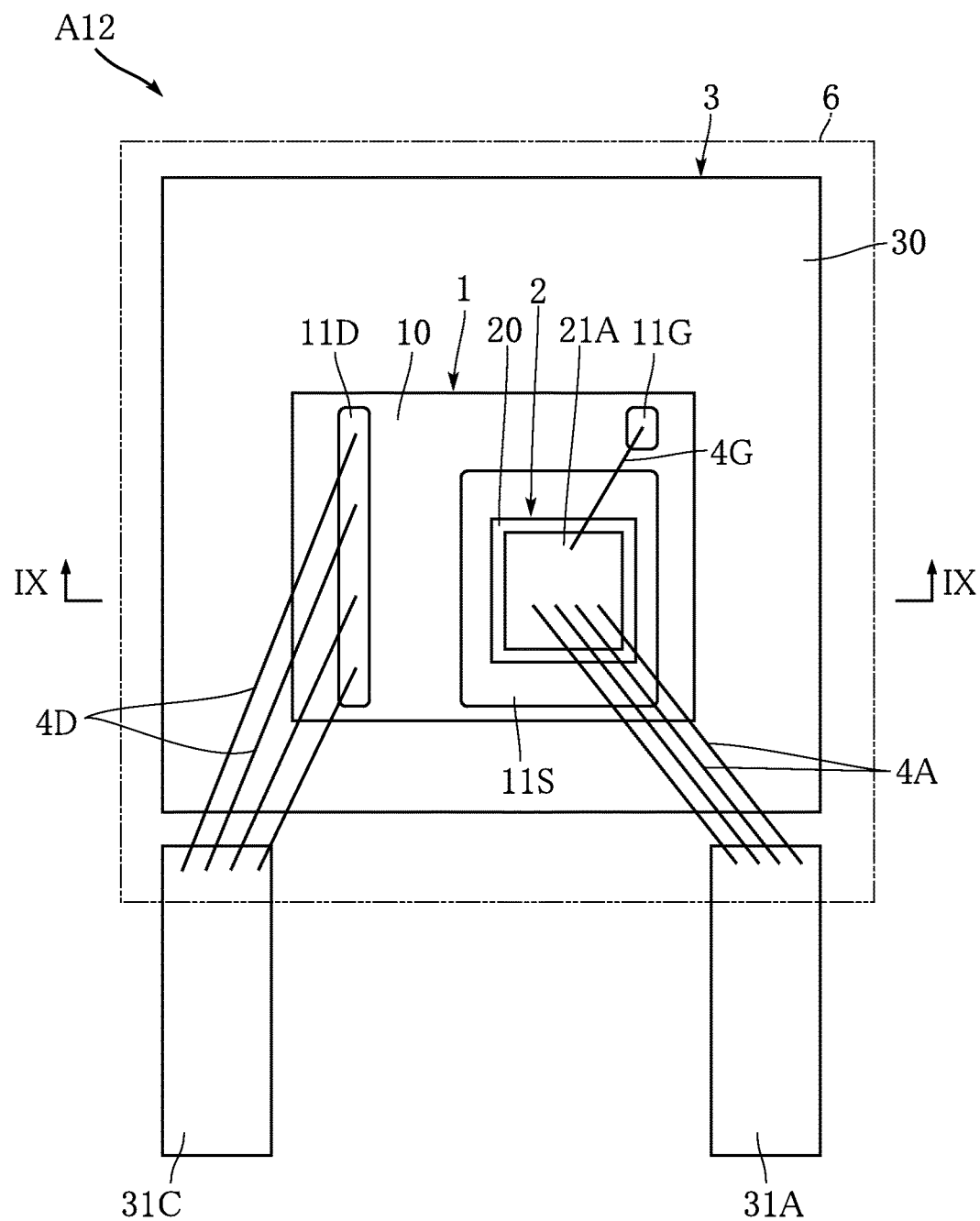
FIG. 8 is a plan view showing a second variation of the semiconductor rectifier according to the first embodiment of the present disclosure.
Figure 9:
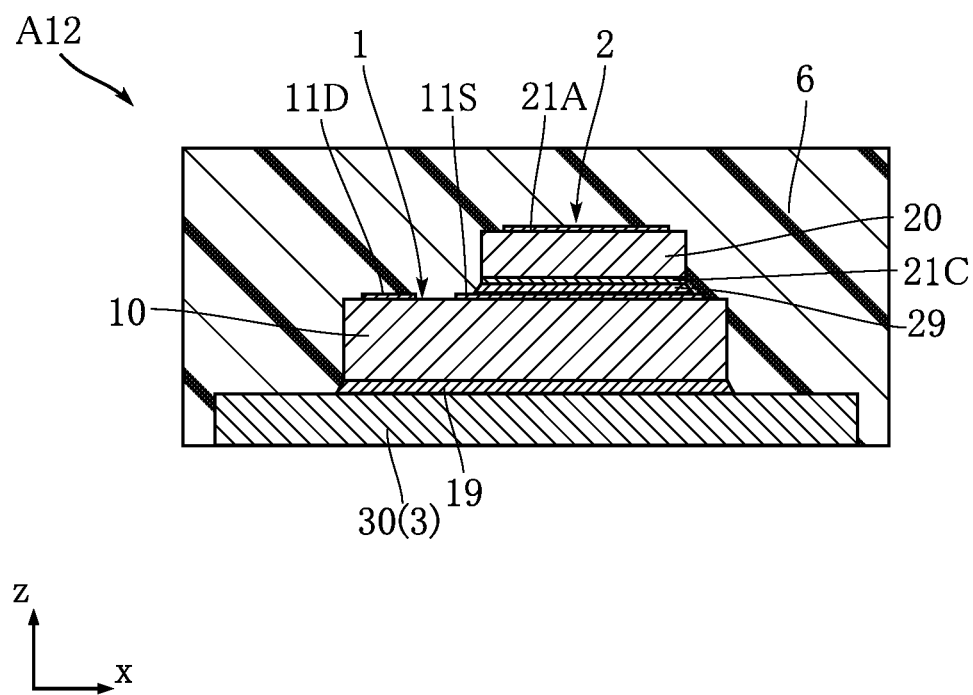
FIG. 9 is a cross-sectional view taken along a line IX-IX in FIG. 8.

FIG. 8 and FIG. 9 illustrate a second variation of the semiconductor rectifier A1. A semiconductor rectifier A12 according to this variation is different from the foregoing examples, in the mounting structure of the diode 2. In this variation, the cathode electrode 21C of the diode 2 is bonded to the source electrode 11S of the transistor 1, via the bonding layer 29. Thus, the diode 2 is superposed on the transistor 1.

With the configuration according to such a variation also, the withstand voltage can be improved, the threshold voltage can be lowered, and the reverse recovery time can be shortened. In addition, the bonding layer 29 serves as the only electrical conduction path between the cathode electrode 21C of the diode 2 and the source electrode 11S of the transistor 1, and the source wires 4S provided in the foregoing examples are excluded. Therefore, the resistance in the electrical conduction path leading to the source electrode 11S can be reduced. Further, the size of the semiconductor rectifier A12 in a z-direction view can be reduced.

Third Variation of First Embodiment

Figure 10:
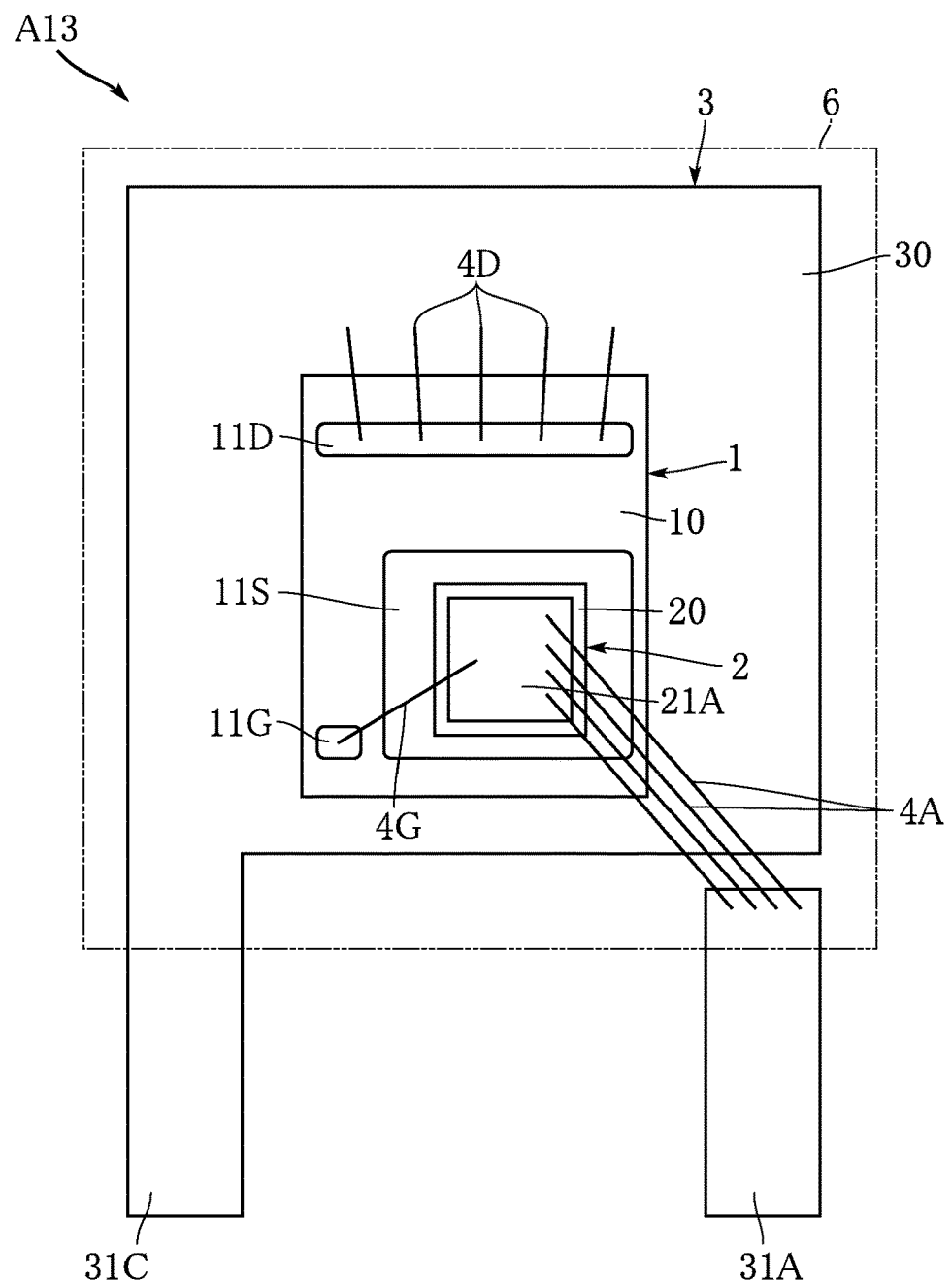
FIG. 10 is a plan view showing a third variation of the semiconductor rectifier according to the first embodiment of the present disclosure.

FIG. 10 illustrates a third variation of the semiconductor rectifier A1. A semiconductor rectifier A13 according to this variation is similar to the semiconductor rectifier A12 in the mounting structure of the transistor 1 and the diode 2, and different from the semiconductor rectifier A12 in the configuration of the lead frame 3. In this variation, the island portion 30 and the cathode terminal 31C are formed as a unified body. The drain wires 4D are connected between the drain electrode 11D and the island portion 30.

With the configuration according to such a variation also, the withstand voltage can be improved, the threshold voltage can be lowered, and the reverse recovery time can be shortened. In addition, the drain wires 4D can be made shorter, compared with those of the semiconductor rectifier A12. Therefore, the resistance in the electrical conduction path between the drain electrode 11D and the cathode terminal 31C can be reduced.

Second Embodiment

Figure 11:
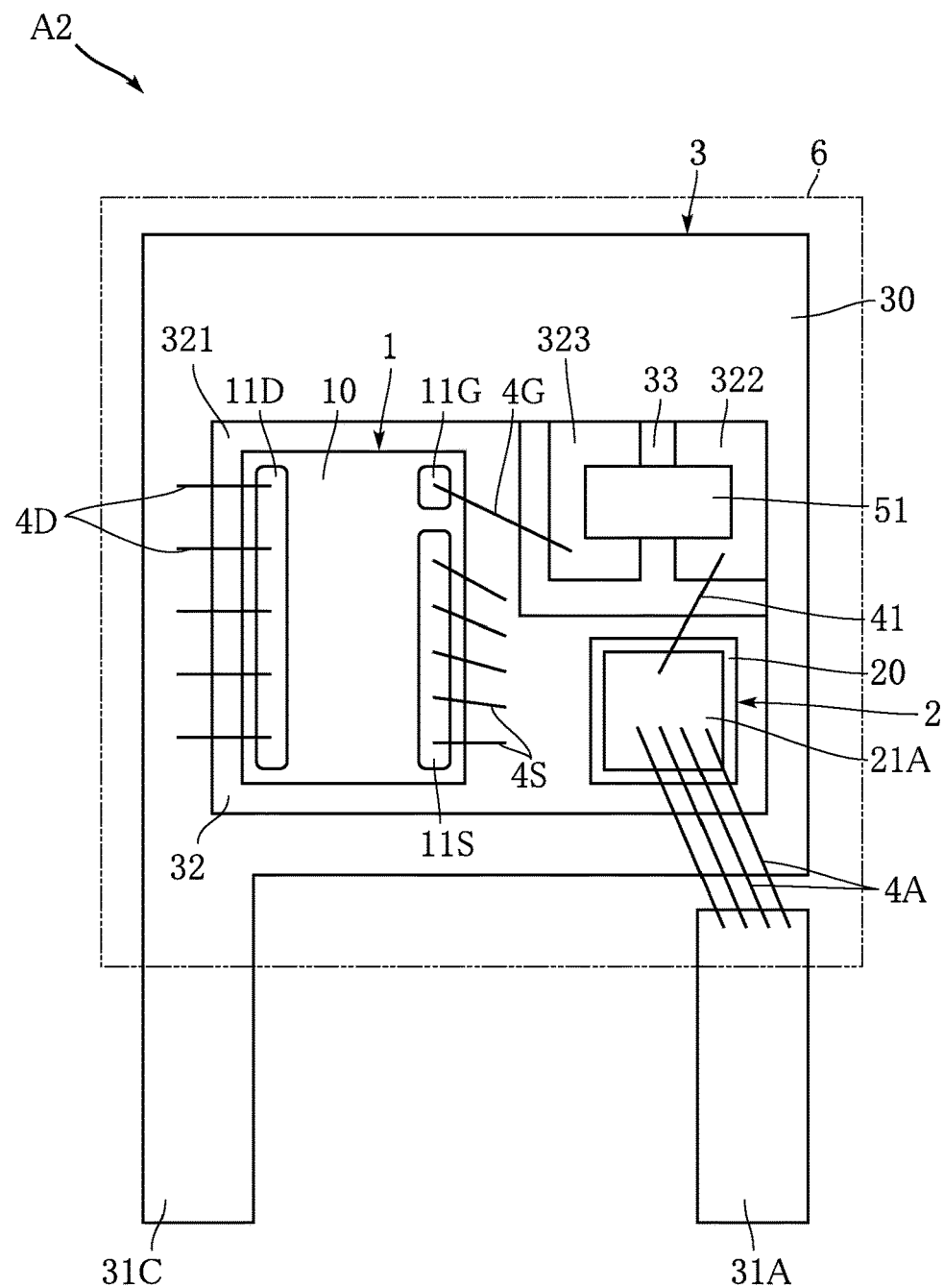
FIG. 11 is a plan view showing a semiconductor rectifier according to a second embodiment of the present disclosure.
Figure 12:
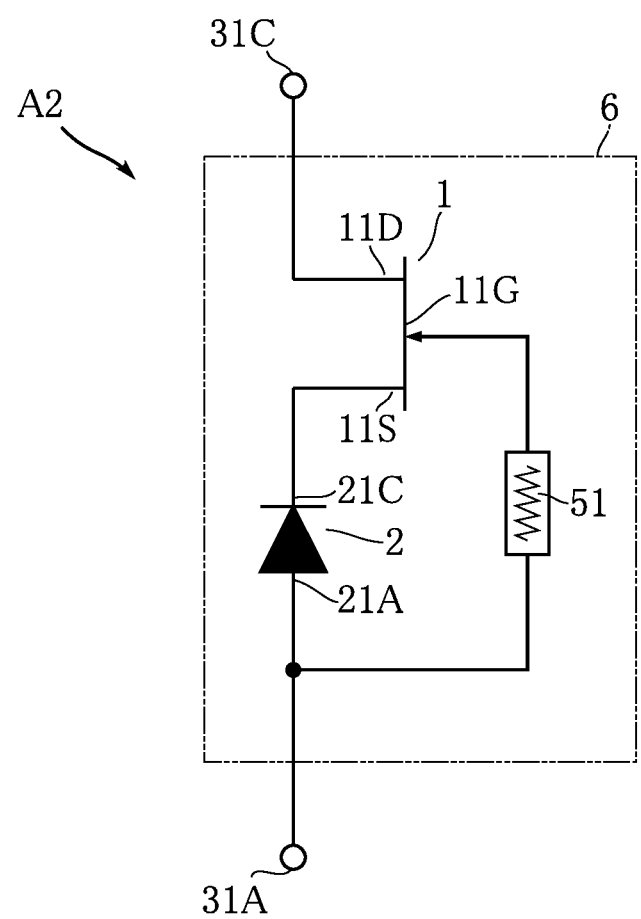
FIG. 12 is a circuit diagram of the semiconductor rectifier according to the second embodiment of the present disclosure.

FIG. 11 and FIG. 12 illustrate a semiconductor rectifier according to a second embodiment of the present disclosure. The semiconductor rectifier A2 according to this embodiment includes a first resistor 51, in addition to the transistor 1 and the diode 2. The first resistor 51 is interposed in the electrical conduction path between the anode terminal 31A and the gate electrode 11G of the transistor 1. Here, the first resistor 51 may be formed as a unified body with either of the transistor 1 and the diode 2.

In the illustrated example, the metal layer 32 is divided into three regions, namely a first region 321, a second region 322, and a third region 323. To the first region 321, the transistor 1 and the diode 2 are bonded. To the second region 322 and the third region 323, the electrodes of the first resistor 51 are respectively bonded. In addition, the wire 41 is connected between the anode electrode 21A of the diode 2 and the second region 322. The gate wire 4G is connected between the third region 323 gate and the electrode 11G.

With the configuration according to this embodiment also, the withstand voltage can be improved, the threshold voltage can be lowered, and the reverse recovery time can be shortened. In addition, since the first resistor 51 is provided, the operation characteristics of the semiconductor rectifier A2 can be modified as desired, by setting the resistance of the first resistor 51 to different levels.

Third Embodiment

Figure 13:
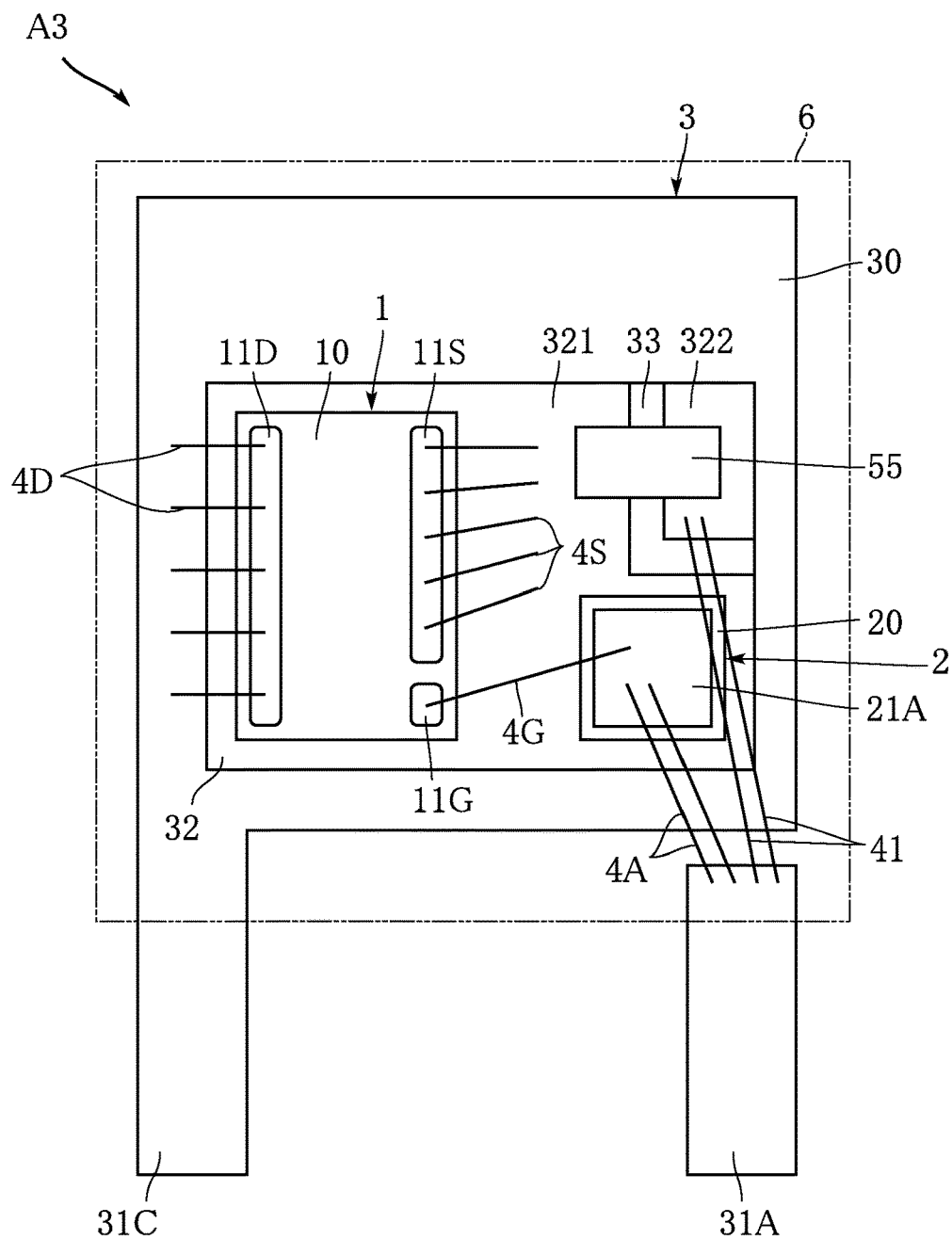
FIG. 13 is a plan view showing a semiconductor rectifier according to a third embodiment of the present disclosure.
Figure 14:
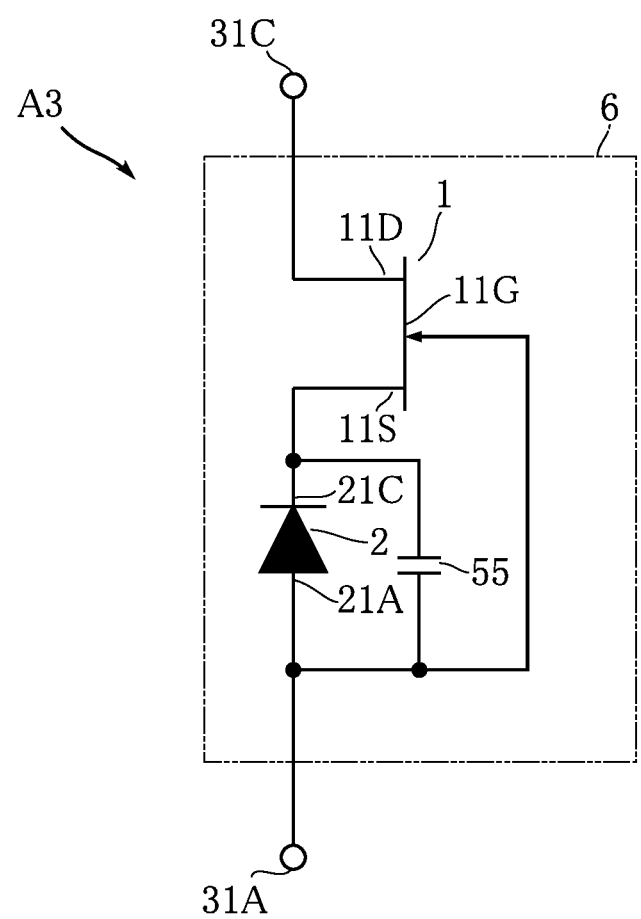
FIG. 14 is a circuit diagram of the semiconductor rectifier according to the third embodiment of the present disclosure.

FIG. 13 and FIG. 14 illustrate a semiconductor rectifier according to a third embodiment of the present disclosure. The semiconductor rectifier A3 according to this embodiment includes a capacitor 55, in addition to the transistor 1 and the diode 2. The capacitor 55 is connected in parallel to the diode 2. Here, the capacitor 55 may be formed as a unified body with either of the transistor 1 and the diode 2.

In the illustrated example, the metal layer 32 includes the first region 321 and the second region 322. To the first region 321, the transistor 1, the diode 2, and one of the electrodes of the capacitor 55 are bonded. To the second region 322, the other electrode of the capacitor 55 is bonded. The wires 41 are connected between the anode terminal 31A and the second region 322.

With the configuration according to this embodiment also, the withstand voltage can be improved, the threshold voltage can be lowered, and the reverse recovery time can be shortened. In addition, the capacitor 55 contributes to improving the characteristics of the semiconductor rectifier A3, as will be subsequently described.

First Variation of Third Embodiment

Figure 15:
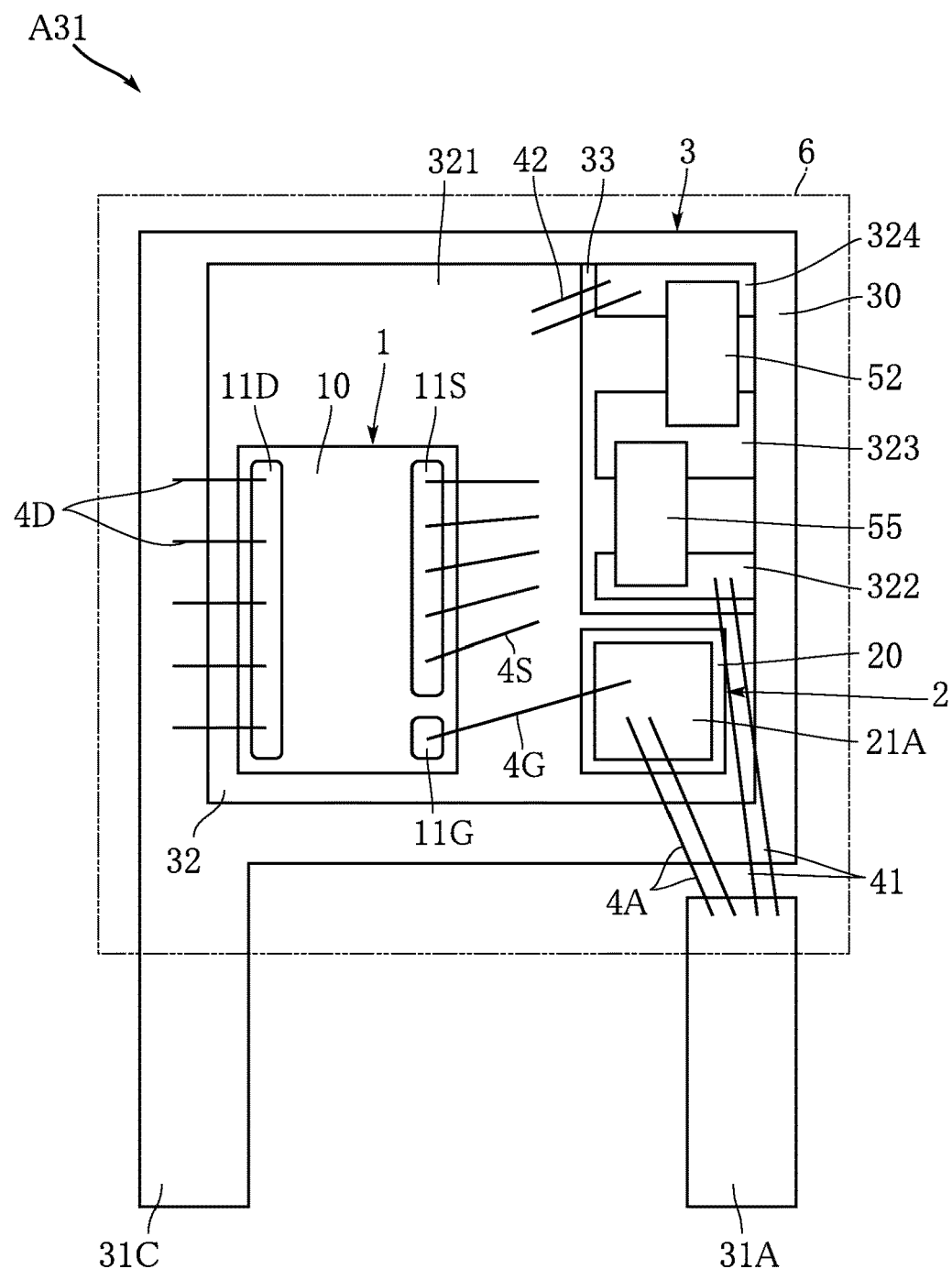
FIG. 15 is a plan view showing a first variation of the semiconductor rectifier according to the third embodiment of the present disclosure.
Figure 16:
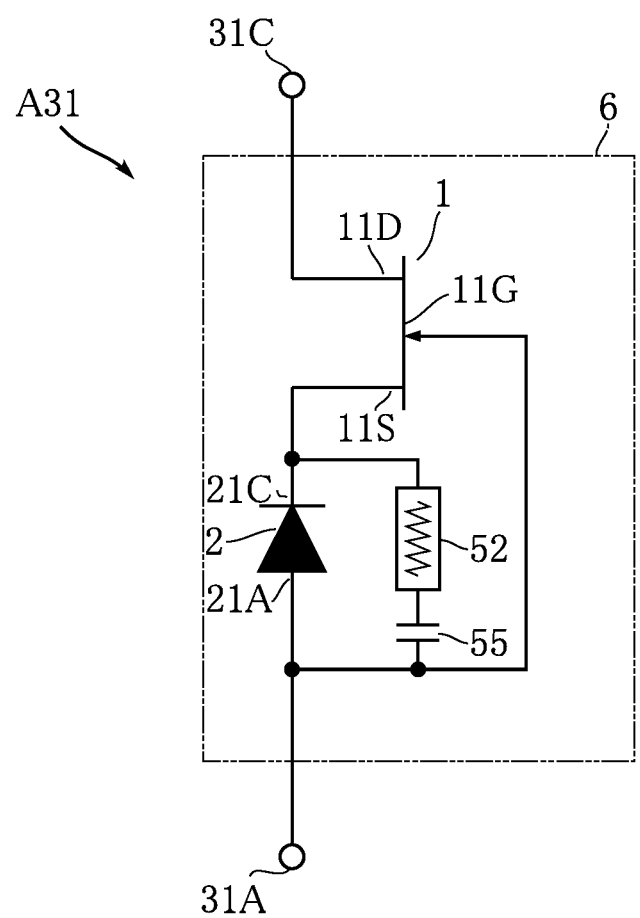
FIG. 16 is a circuit diagram of the first variation of the semiconductor rectifier according to the third embodiment of the present disclosure.

FIG. 15 and FIG. 16 illustrate a first variation of the semiconductor rectifier according to the third embodiment of the present disclosure. A semiconductor rectifier A31 according to this variation includes a second resistor 52. The second resistor 52 is connected in series to the capacitor 55, and included in the electrical conduction path between the capacitor 55 and the source electrode 11S. Here, the second resistor 52 may be formed as a unified body with either of the transistor 1 and the diode 2.

In the illustrated example, the metal layer 32 includes the first region 321, the second region 322, the third region 323, and a fourth region 324. To the first region 321, the transistor 1 and the diode 2 are bonded. To the second region 322, one of the electrodes of the capacitor 55 is bonded. To the third region 323, the other electrode of the capacitor 55 and one of the electrodes of the second resistor 52 are bonded. To the fourth region 324, the other electrode of the second resistor 52 is bonded.

The wires 41 are connected between the anode terminal 31A and the second region 322. In addition, A plurality of wires 42 are connected between the fourth region 324 and the first region 321.

With the configuration according to this embodiment also, the withstand voltage can be improved, the threshold voltage can be lowered, and the reverse recovery time can be shortened.

Figure 17:
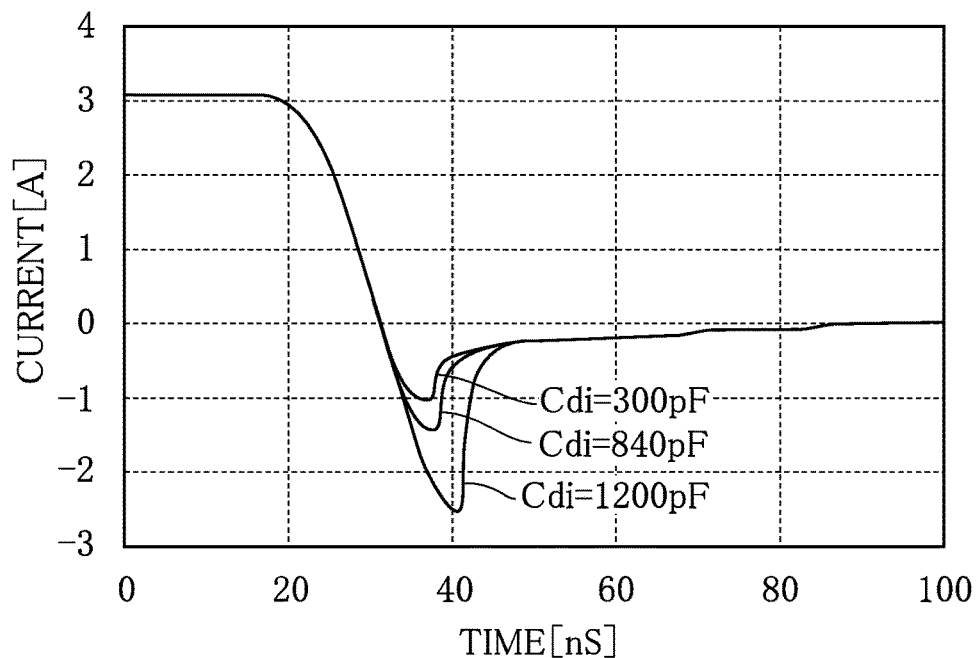
FIG. 17 is a graph showing the reverse recovery characteristics of the semiconductor rectifier according to the first embodiment of the present disclosure.
Figure 18:
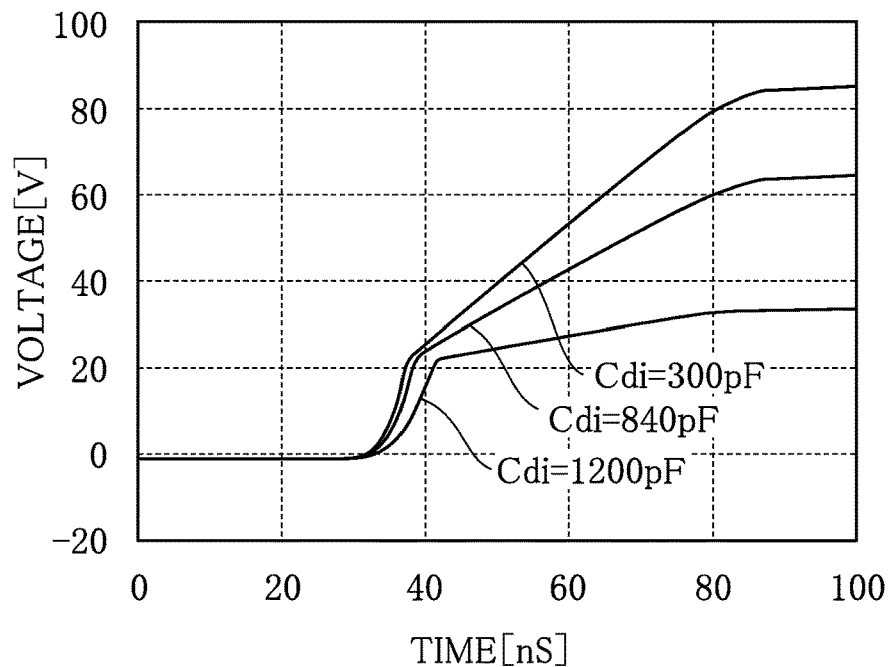
FIG. 18 is a graph showing diode voltages of the semiconductor rectifier according to the first embodiment of the present disclosure.

Before proceeding to the description of the characteristics of the semiconductor rectifier A3 and the semiconductor rectifier A31, the characteristics of the semiconductor rectifier A1 will be described hereunder, with reference to FIG. 17 and FIG. 18. The diode 2 contains therein an electrostatic capacitance, which may vary depending on the material of the main body 20, the anode electrode 21A, and the cathode electrode 21C, and the connection arrangement among those. FIG. 17 is a graph indicating the reverse recovery characteristics realized when the electrostatic capacitance Cdi of the diode 2 is set to 300 pF, 840 pF, and 1200 pF, and FIG. 18 is a graph indicating the voltages inside the diode 2, respectively corresponding to the electrostatic capacitances of the diode 2. FIG. 17 and FIG. 18 represent simulation results. As shown in FIG. 17, the smaller the electrostatic capacitance Cdi is, the shorter the reverse recovery time becomes. On the other hand, there is a contradiction in that, as shown in FIG. 18, the smaller the electrostatic capacitance Cdi is, the higher the voltage in the diode 2 becomes. Diodes that may adopted as the diode 2 tend to present the lower initial voltage, the lower the withstand voltage is. This initial voltage constitutes a major factor that determines the initial voltage of the semiconductor rectifier A1. Therefore, in order to attain a higher withstand voltage while suppressing the initial voltage in the semiconductor rectifier A1, it is necessary to increase the divided voltage of the transistor 1, while suppressing the voltage generated in the diode 2 to a low level. To increase the divided voltage of the transistor 1, it is preferable that a relation of 2Cds≤Cdi+Cgs is satisfied, where Cds represents the electrostatic capacitance between the drain electrode 11D and the source electrode 11S of the transistor 1, Cqs represents the electrostatic capacitance between the gate electrode 11G and the source electrode 11S, and Cdi represents the electrostatic capacitance of the diode 2.

Figure 19:
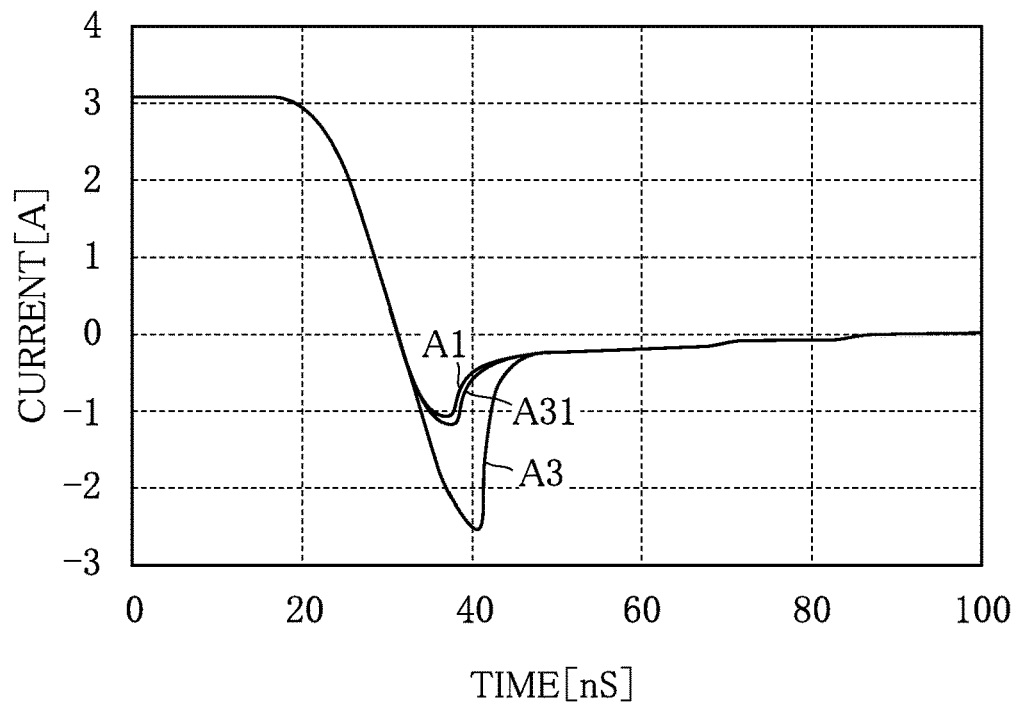
FIG. 19 is a graph showing the reverse recovery characteristics of the semiconductor rectifier according to the third embodiment of the present disclosure.
Figure 20:
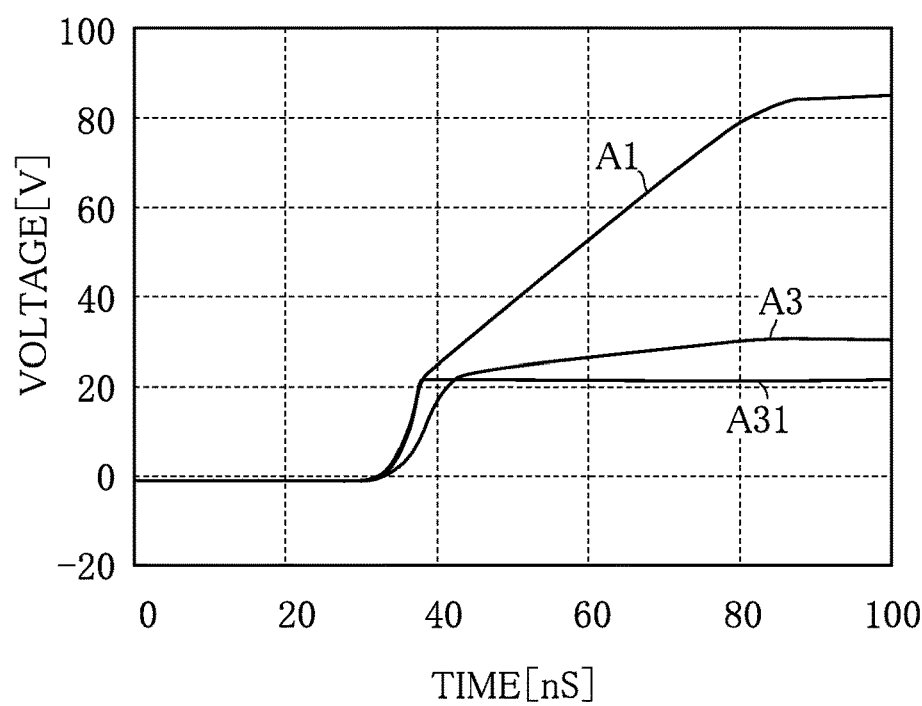
FIG. 20 is a graph showing the diode voltages of the semiconductor rectifier according to the third embodiment of the present disclosure.

Referring now to FIG. 19 and FIG. 20, the characteristics of the semiconductor rectifier A1, the semiconductor rectifier A3, and the semiconductor rectifier A31 will be described hereunder. FIG. 19 is a graph showing the reverse recovery characteristics, and FIG. 20 is a graph showing the voltage of the diode 2. These graphs represent simulation results obtained under the condition that the electrostatic capacitance Cdi of the semiconductor rectifier A1, the semiconductor rectifier A3, and the semiconductor rectifier A31 is 300 pF, the electrostatic capacitance Cxd of the capacitor 55 of the semiconductor rectifier A3 and the semiconductor rectifier A31 is 470 pF, and a resistance R2 of the second resistor 52 of the semiconductor rectifier A31 is 100Ω.

As shown in FIG. 19, the reverse recovery time of the semiconductor rectifier A3 is obviously longer than that of the semiconductor rectifier A1. This means that adding only the capacitor 55 leads to prolonged reverse recovery time. In contrast, the reverse recovery time of the semiconductor rectifier A31 is substantially the same as that of the semiconductor rectifier A1, and obviously shorter than that of the semiconductor rectifier A3. This means that further adding the second resistor 52, connected in series to the capacitor 55, leads to shortened reverse recovery time.

In addition, as shown in FIG. 20, while the voltage of the diode 2 of the semiconductor rectifier A1 sharply rises with time, the voltage of the semiconductor rectifier A3 is obviously lower. The voltage of the semiconductor rectifier A31 is even lower than the voltage of the semiconductor rectifier A3. This means that adding the capacitor 55 contributes to effectively lowering the divided voltage of the diode 2. From such viewpoints, it is preferable that the electrostatic capacitance Cds between the drain electrode 11D and the source electrode 11S of the transistor 1, the electrostatic capacitance Cgs between the gate electrode 11G and the source electrode 11S, the electrostatic capacitance Cdi of the diode 2, and the electrostatic capacitance Cxd of the capacitor 55 satisfy a relation of 2Cds≤Cdi+Cgs+Cxd.

Fourth Embodiment

Figure 21:
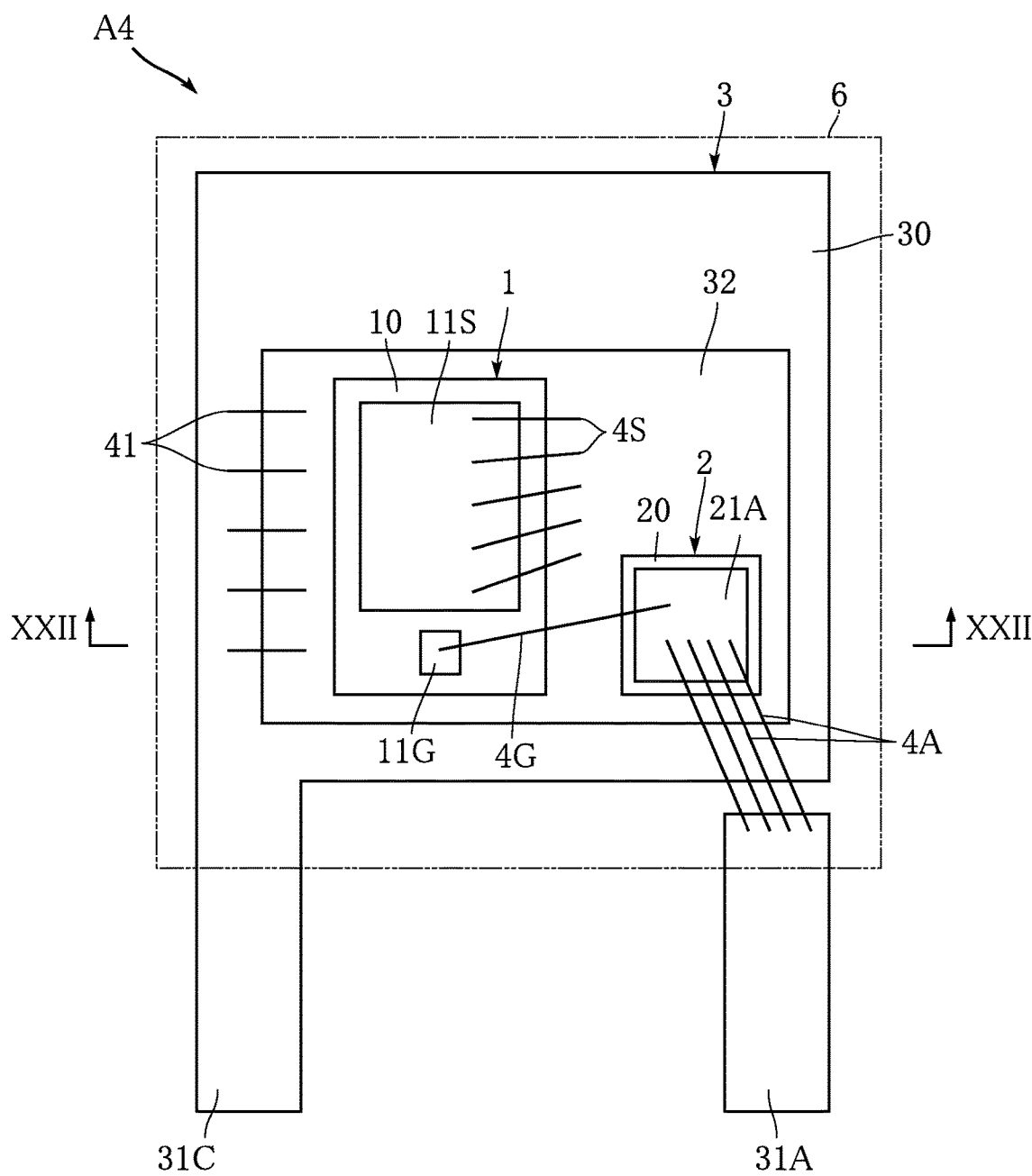
FIG. 21 is a plan view showing a semiconductor rectifier according to a fourth embodiment of the present disclosure.
Figure 22:
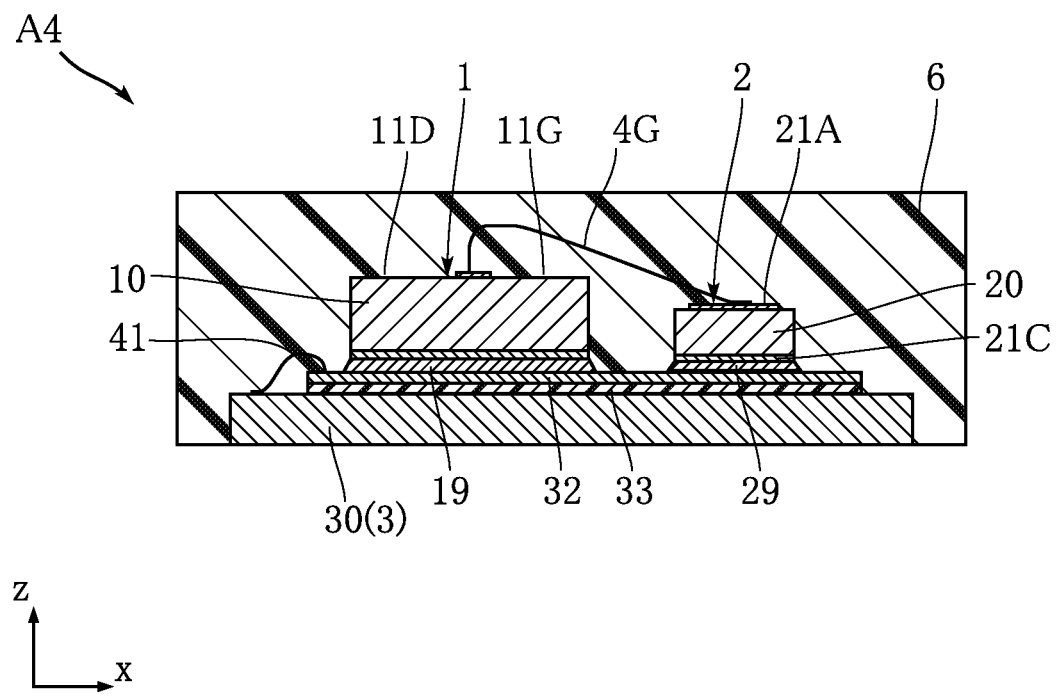
FIG. 22 is a cross-sectional view taken along a line XXII-XXII in FIG. 21.

FIG. 21 and FIG. 22 illustrate a semiconductor rectifier according to a fourth embodiment of the present disclosure. The semiconductor rectifier A4 according to this embodiment is different from the foregoing embodiments in the configuration of the transistor 1. In the transistor 1 according to this embodiment, the main body 10 includes a SiC semiconductor layer, thus to constitute what is known as a vertical transistor. The source electrode 11S and the gate electrode 11G are located on the upper face of the main body 10, and the drain electrode 11D is located on the lower face, on the opposite side of the source electrode 11S and the gate electrode 11G. The drain electrode 11D of the transistor 1 is bonded to the metal layer 32 via the bonding layer 19. The bonding layer 19 is formed of a conductive material, such as solder.

The island portion 30 and the cathode terminal 31C are formed as a unified body. The wires 41 are connected between the metal layer 32 and the island portion 30. Accordingly, the drain electrode 11D of the transistor 1 and the cathode terminal 31C are electrically connected to each other, via the bonding layer 19, the metal layer 32, the wires 41 and the island portion 30.

With the configuration according to this embodiment also, the withstand voltage can be improved, the threshold voltage can be lowered, and the reverse recovery time can be shortened. In addition, the size of the semiconductor rectifier A4 in a z-direction view can be reduced.

First Variation of Fourth Embodiment

Figure 23:
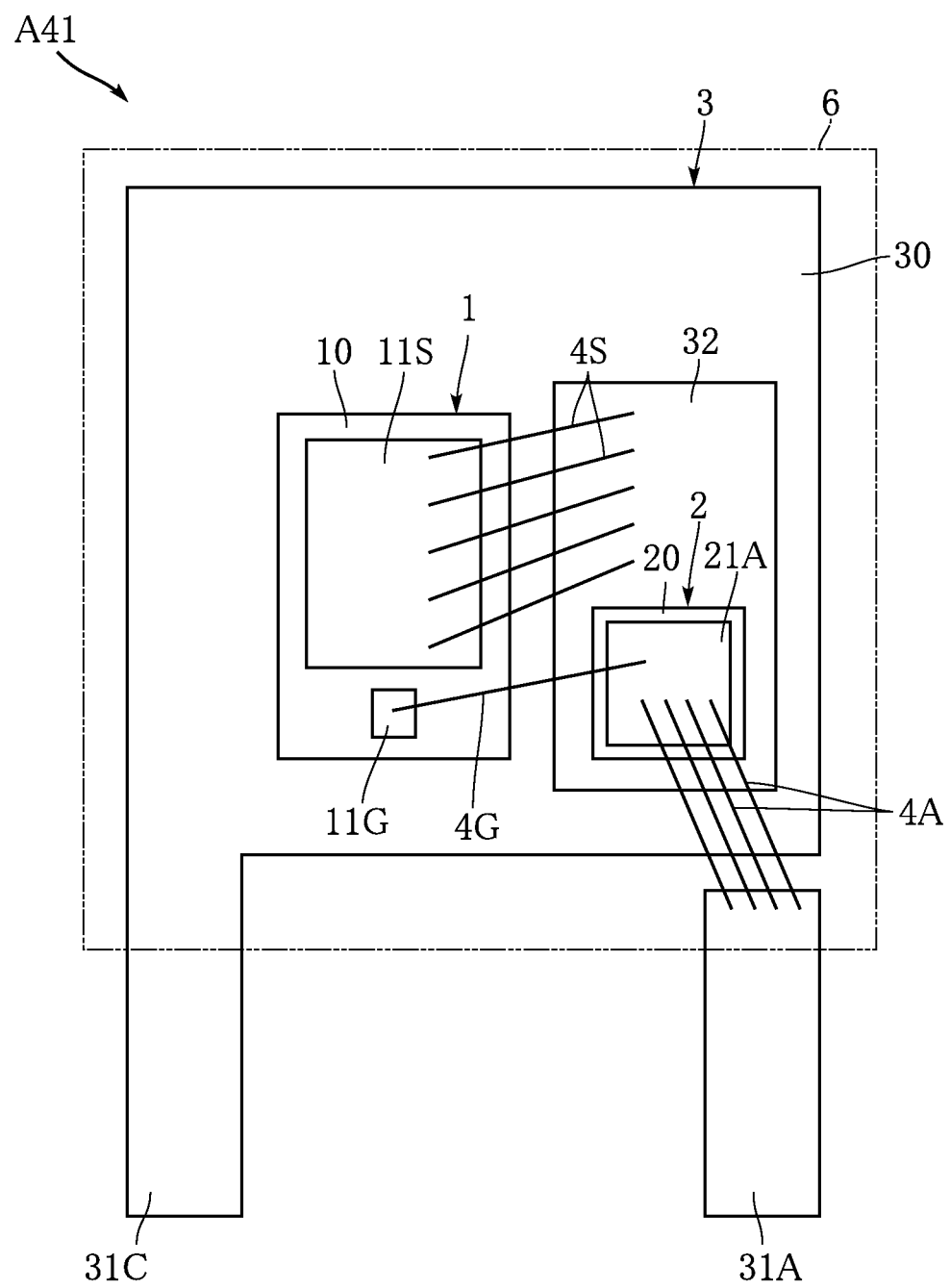
FIG. 23 is a plan view showing a first variation of the semiconductor rectifier according to the fourth embodiment of the present disclosure.

FIG. 23 illustrates a first variation of the semiconductor rectifier A4. A semiconductor rectifier A41 according to this variation is different from the semiconductor rectifier A4, in the configuration of the metal layer 32 and the insulation layer 33. In this variation, the metal layer 32 and the insulation layer 33 overlap with the diode 2 when viewed in the z-direction, but not with the transistor 1.

The cathode electrode 21C of the diode 2 is conductively bonded to the metal layer 32, via the bonding layer 29. The source wires 4S are connected between the metal layer 32 and the source electrode 11S of the transistor 1. The drain electrode 11D of the transistor 1 is conductively bonded to the island portion 30, via the bonding layer 19.

With the configuration according to this embodiment also, the withstand voltage can be improved, the threshold voltage can be lowered, and the reverse recovery time can be shortened. In addition, the drain electrode 11D and the cathode terminal 31C are electrically connected to each other, only via the bonding layer 19 and the island portion 30. Therefore, the resistance of the electrical conduction path between the drain electrode 11D and the cathode terminal 31C can be reduced.

Second Variation of Fourth Embodiment

Figure 24:
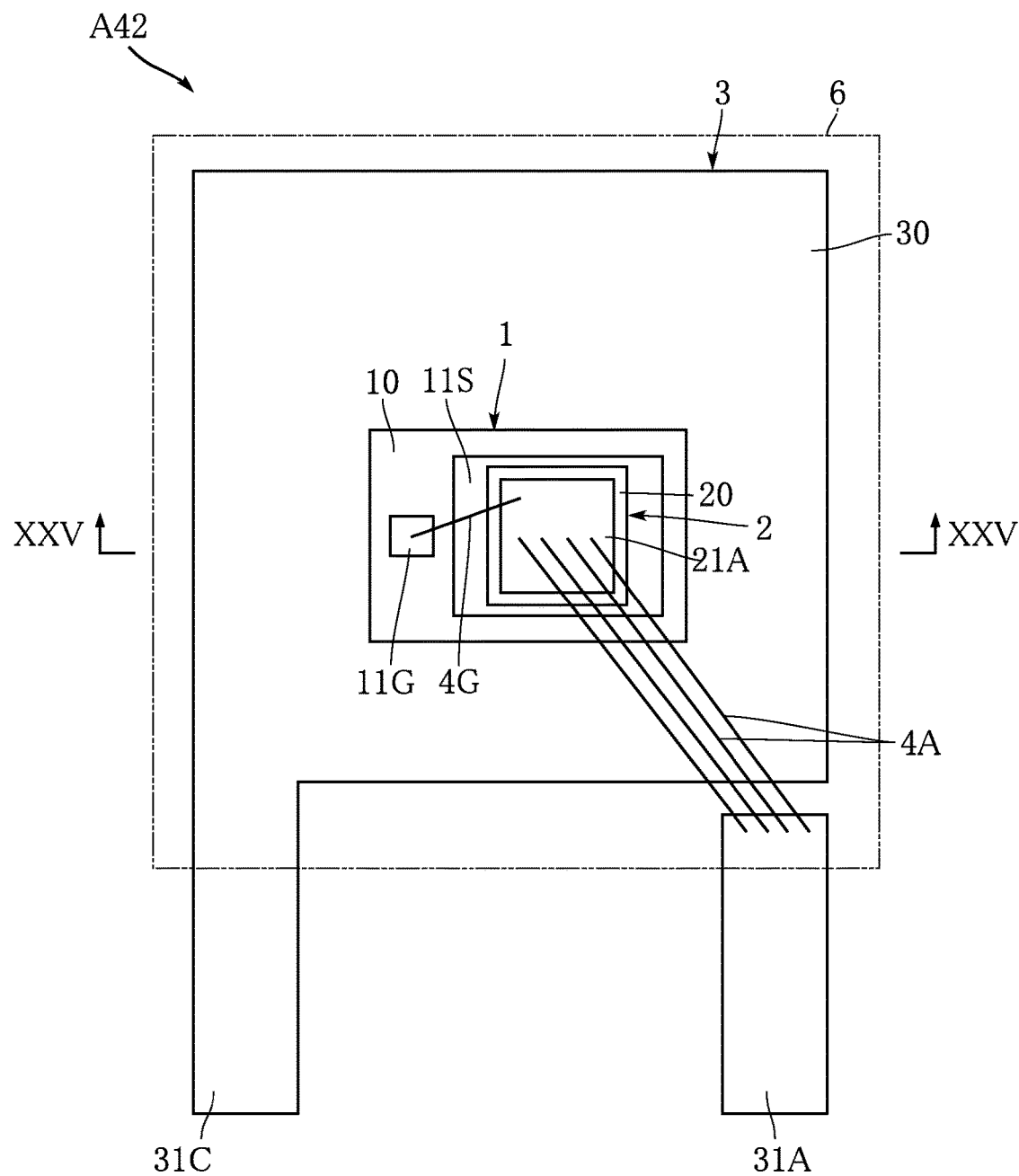
FIG. 24 is a plan view showing a second variation of the semiconductor rectifier according to the fourth embodiment of the present disclosure.
Figure 25:
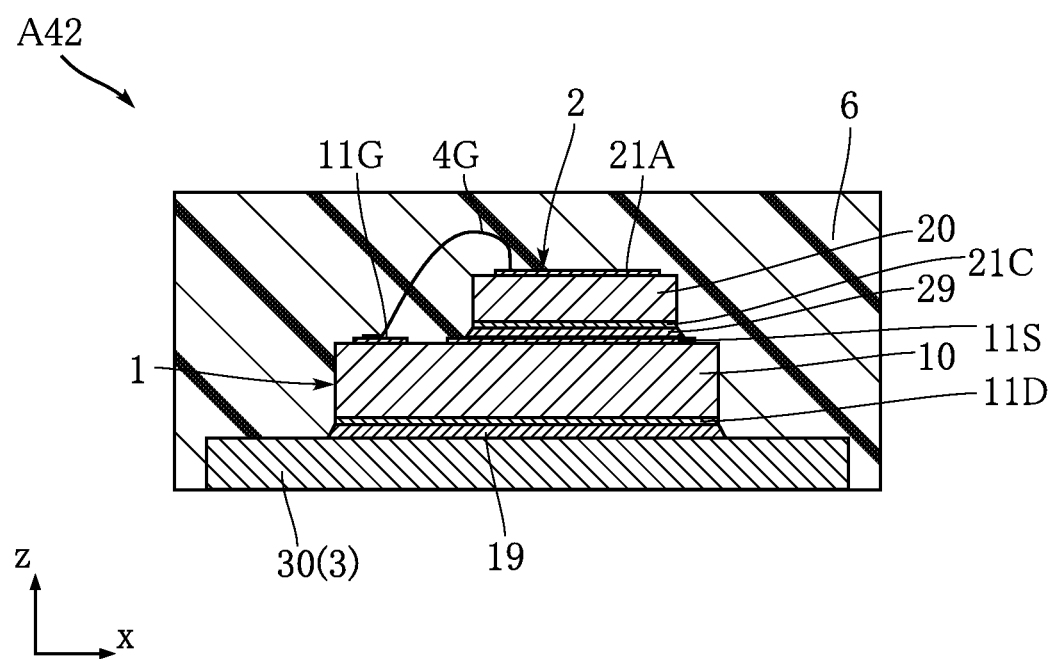
FIG. 25 is a cross-sectional view taken along a line XXV-XXV in FIG. 24.

FIG. 24 and FIG. 25 illustrate a second variation of the semiconductor rectifier A4. In a semiconductor rectifier A42 according to this variation, the diode 2 is superposed on the transistor 1. In other words, the cathode electrode 21C of the diode 2 is conductively bonded to the source electrode 11S of the transistor 1, via the bonding layer 29. Further, the drain electrode 11D of the transistor 1 is conductively bonded to the island portion 30, via the bonding layer 19.

With the configuration according to this embodiment also, the withstand voltage can be improved, the threshold voltage can be lowered, and the reverse recovery time can be shortened. In addition, the foregoing configuration contributes to reducing the resistance of the electrical conduction path between the cathode electrode 21C and the source electrode 11S, and the electrical conduction path between the drain electrode 11D and the cathode terminal 31C.

Fifth Embodiment

Figure 26:
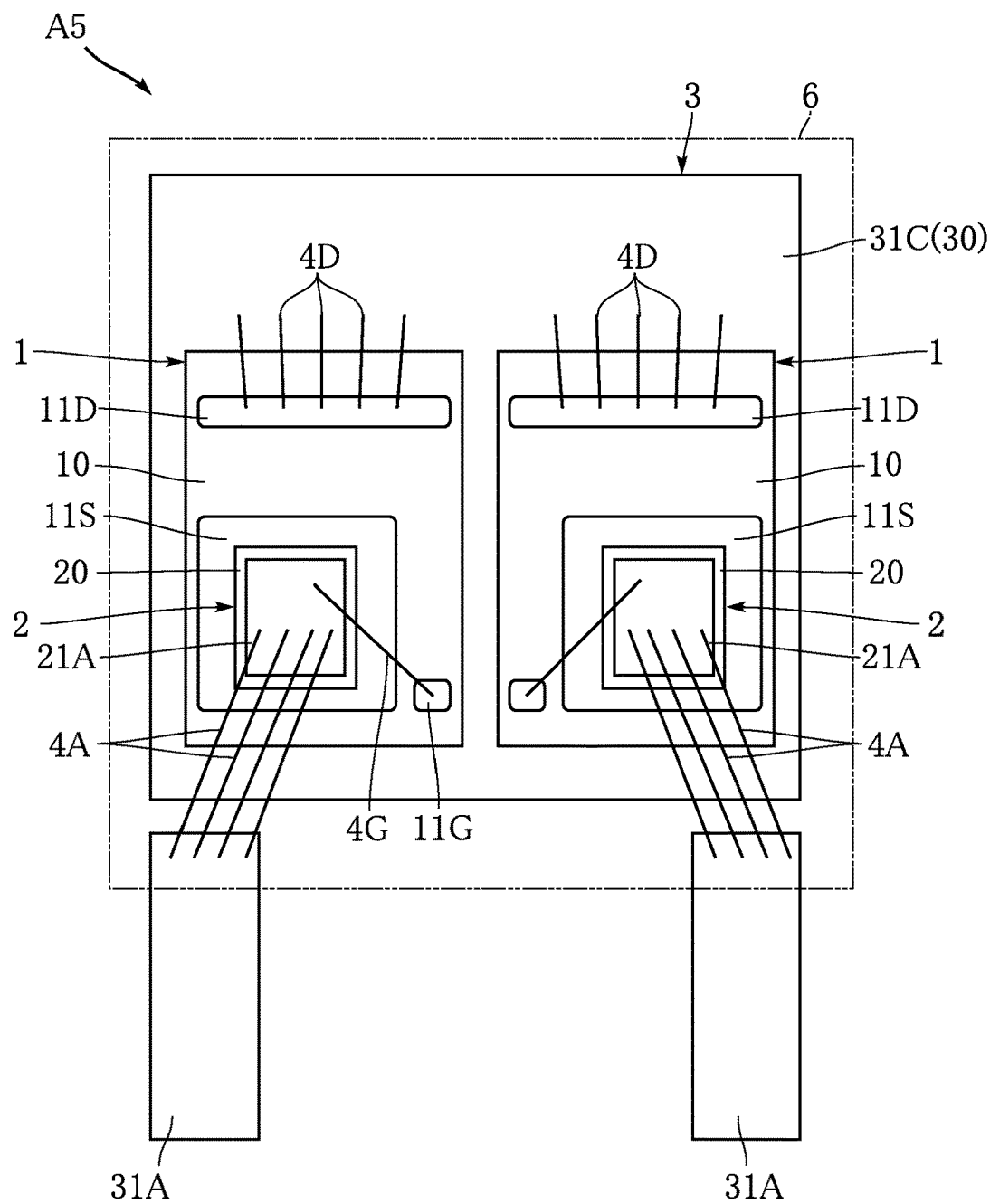
FIG. 26 is a plan view showing a semiconductor rectifier according to a fifth embodiment of the present disclosure.
Figure 27:
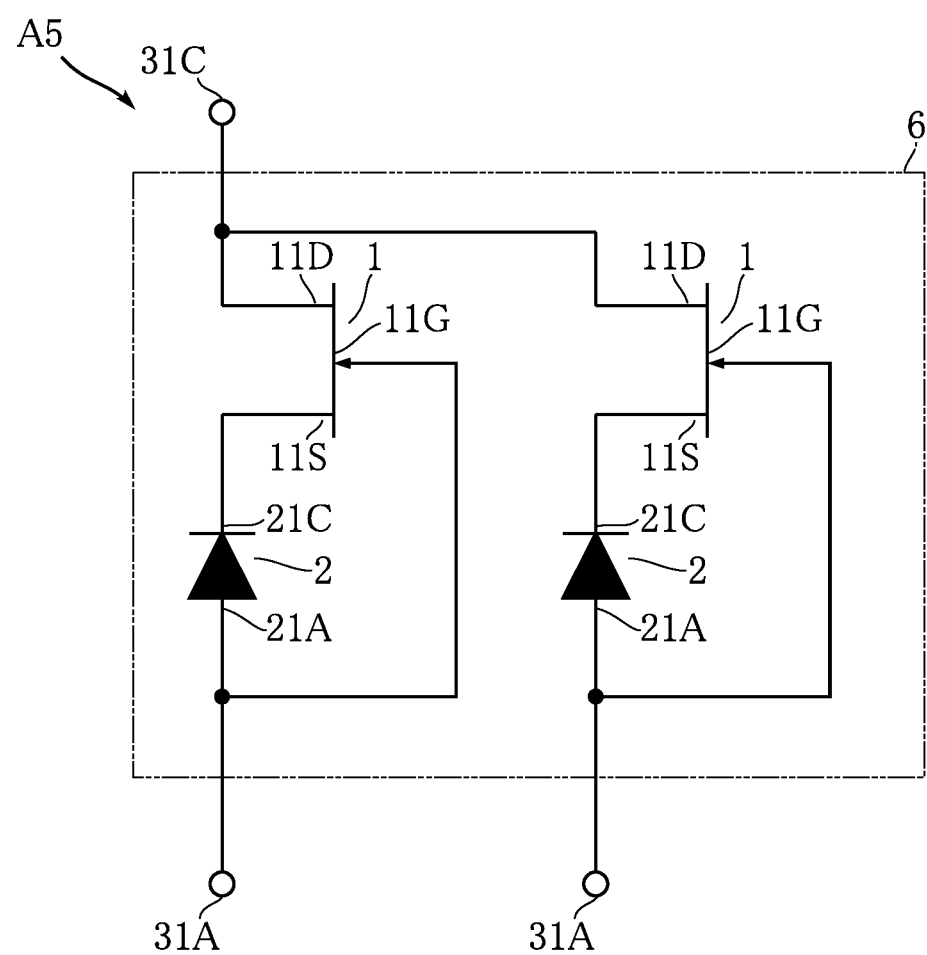
FIG. 27 is a circuit diagram of the semiconductor rectifier according to the fifth embodiment of the present disclosure.

FIG. 26 and FIG. 27 illustrate a semiconductor rectifier according to a fifth embodiment of the present disclosure. The semiconductor rectifier A5 according to this embodiment includes two transistors 1 and two diodes 2.

The two transistors 1 are both bonded to the island portion 30, via the bonding layer 19. The cathode electrode 21C of each of the diodes 2 is conductively bonded to the source electrode 11S of the corresponding transistor 1, via the bonding layer 29.

The lead frame 3 includes the cathode terminal 31C and two anode terminals 31A. The cathode terminal 31C also serves as the island portion 30. The two anode terminals 31A are spaced apart from the cathode terminal 31C (island portion 30), in the y-direction. The anode wires 4A are connected between each pair of the anode terminal 31A and the anode electrode 21A of the diode 2. The drain wires 4D are connected between each pair of the drain electrode 11D of the transistor 1 and the island portion 30. Thus, the drain electrodes 11D of the respective transistors 1 are electrically connected to each other.

In the illustrated example, further, the transistors 1, the diodes 2, the anode terminals 31A, the anode wires 4A, the gate wires 4G, and the drain wires 4D are located in a line-symmetrical position, with respect to the center of the semiconductor rectifier A5 in the x-direction.

With the configuration according to this embodiment also, the withstand voltage can be improved, the threshold voltage can be lowered, and the reverse recovery time can be shortened. In addition, the use of only either of the anode terminals 31A and the cathode terminal 31C, or the use of both of the anode terminals 31A and the cathode terminal 31C can be selected as desired. Therefore, the semiconductor rectifier A5 can be employed, for example, when currents of different magnitudes are to be supplied, and when currents of different systems are to be controlled.

Sixth Embodiment

Figure 28:
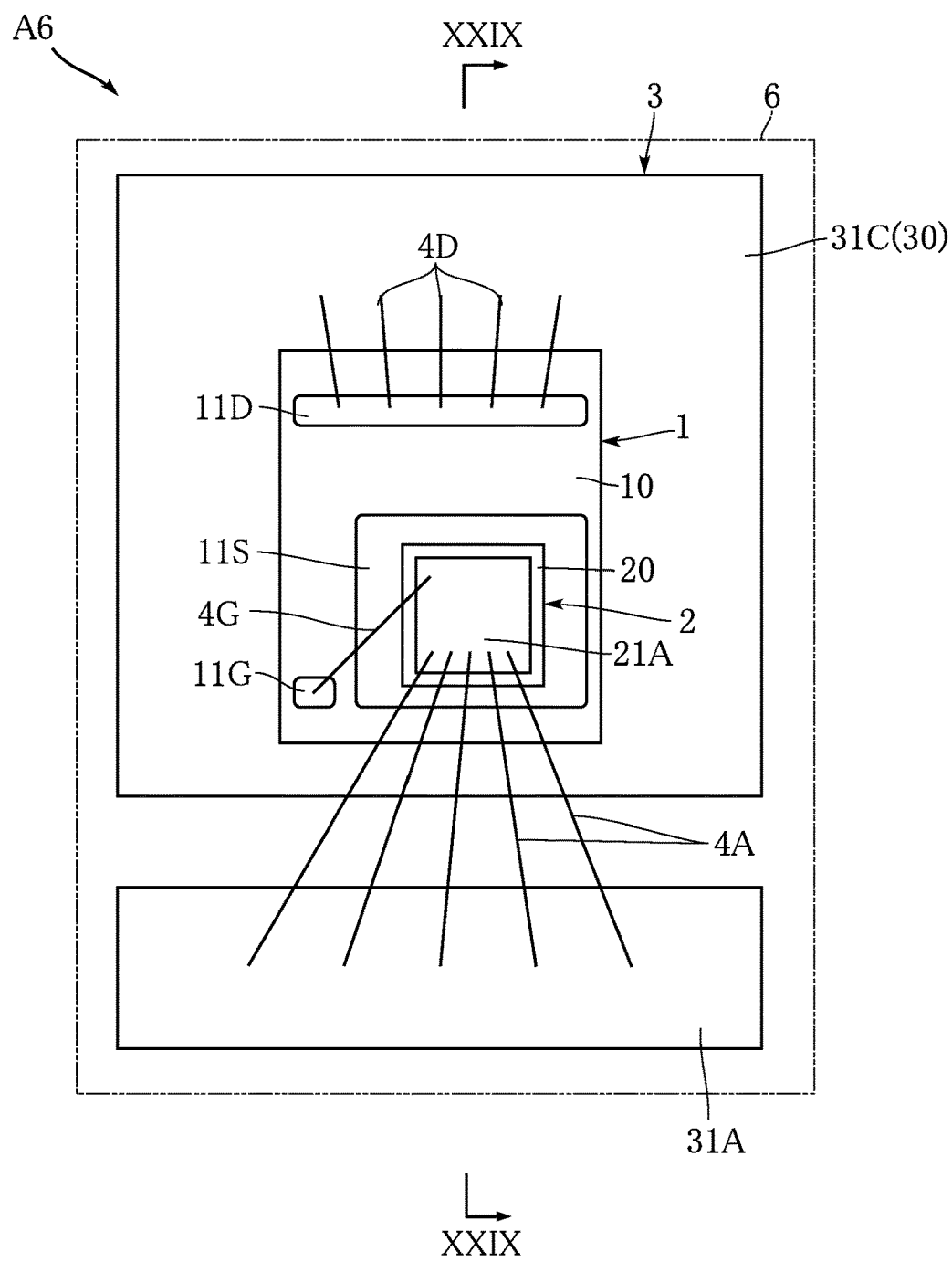
FIG. 28 is a plan view showing a semiconductor rectifier according to a sixth embodiment of the present disclosure.
Figure 29:
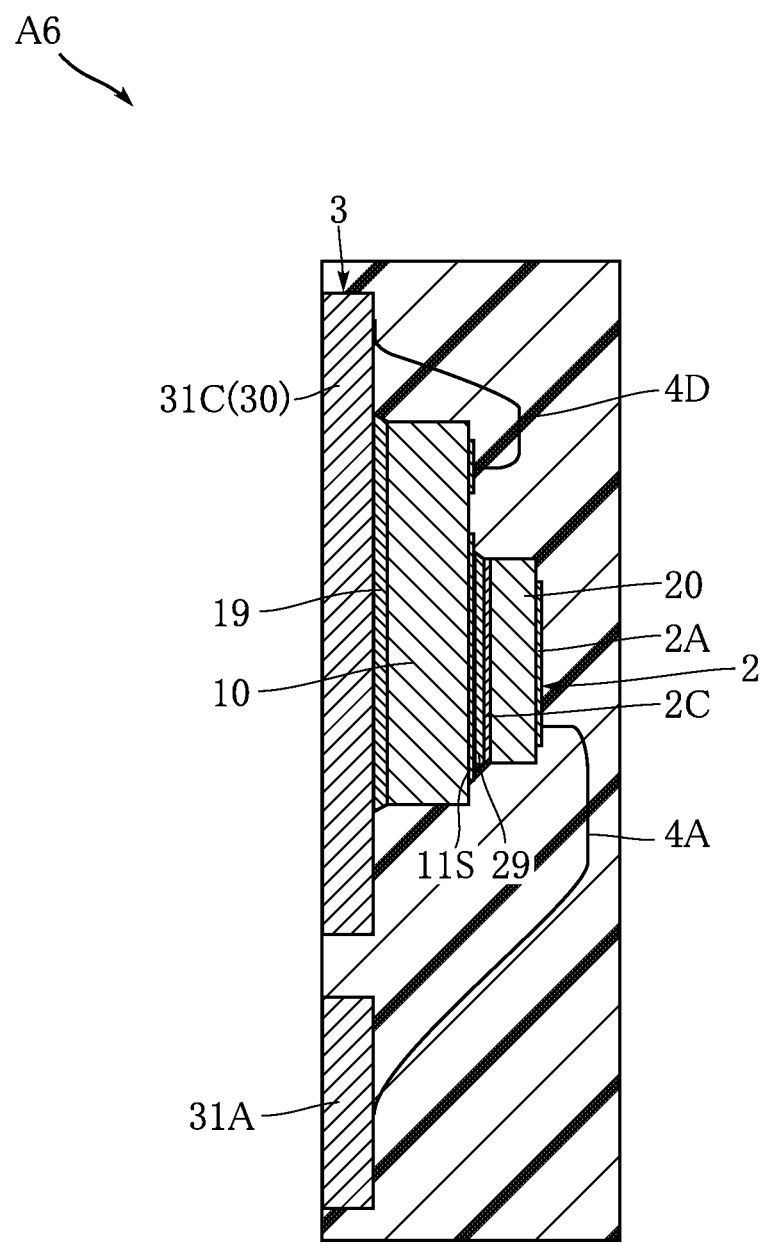
FIG. 29 is a cross-sectional view taken along a line XXIX-XXIX in FIG. 28.

FIG. 28 illustrates a semiconductor rectifier according to a sixth embodiment of the present disclosure. The semiconductor rectifier A6 according to this embodiment is set up as what is known as a surface-mounted semiconductor rectifier.

In this embodiment, the lead frame 3 includes the cathode terminal 31C, serving also as the island portion 30, and the anode terminal 31A. The anode terminal 31A and the cathode terminal 31C both have a rectangular shape when viewed in the z-direction, and are spaced apart from each other in the y-direction.

The transistor 1 is mounted on the island portion 30 (cathode terminal 31C). The diode 2 is superposed on the transistor 1, and the cathode electrode 21C is conductively bonded to the source electrode 11S, via the bonding layer 29. The drain wires 4D are connected between the drain electrode 11D and the cathode terminal 31C. The anode wires 4A are connected between the anode terminal 31A and the anode electrode 21A.

With the configuration according to this embodiment also, the withstand voltage can be improved, the threshold voltage can be lowered, and the reverse recovery time can be shortened. In addition, the semiconductor rectifier A6 can be mounted on a non-illustrated circuit board, for example using a reflow oven.

Seventh Embodiment

Figure 30:
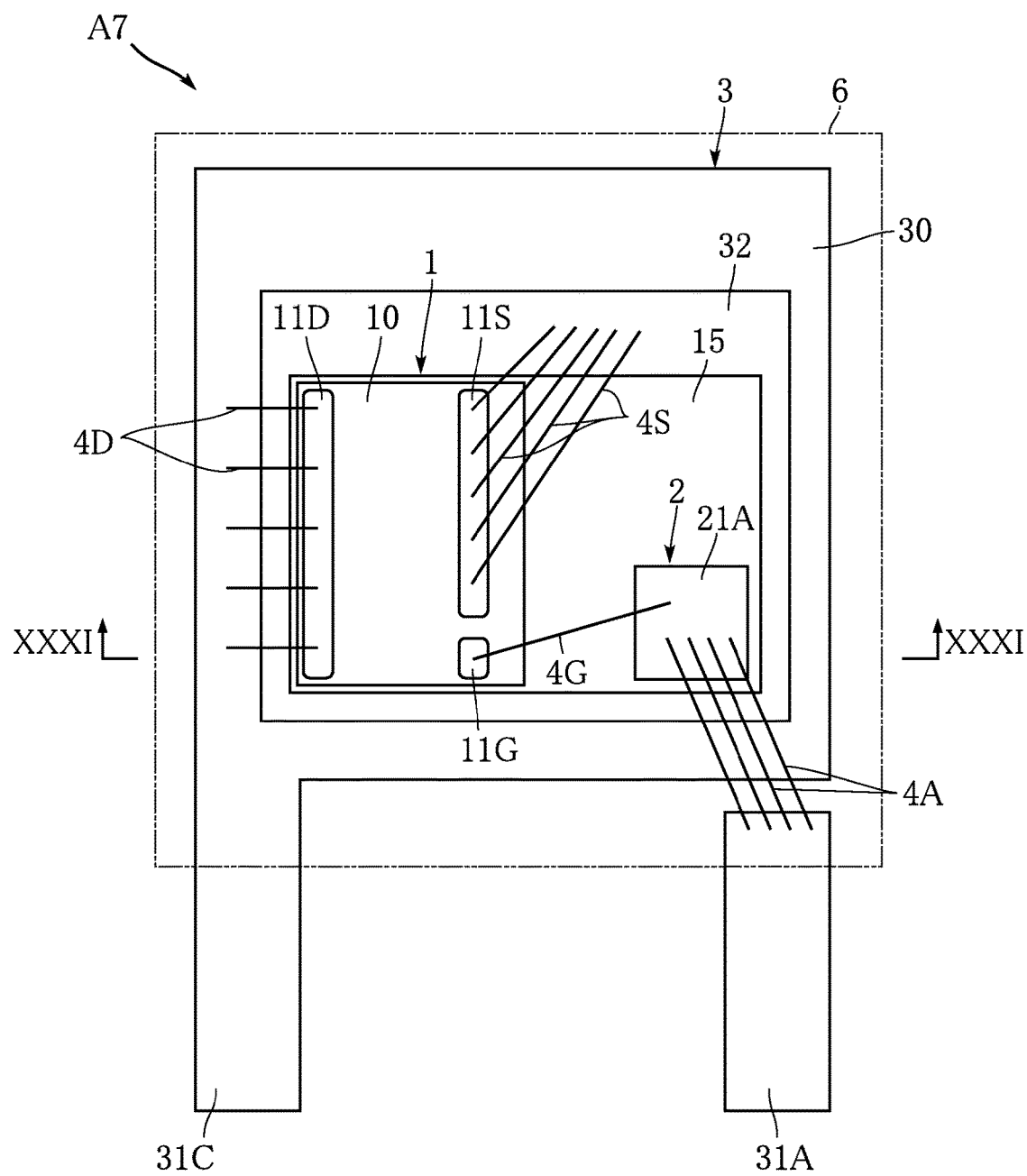
FIG. 30 is a plan view showing a semiconductor rectifier according to a seventh embodiment of the present disclosure.
Figure 31:
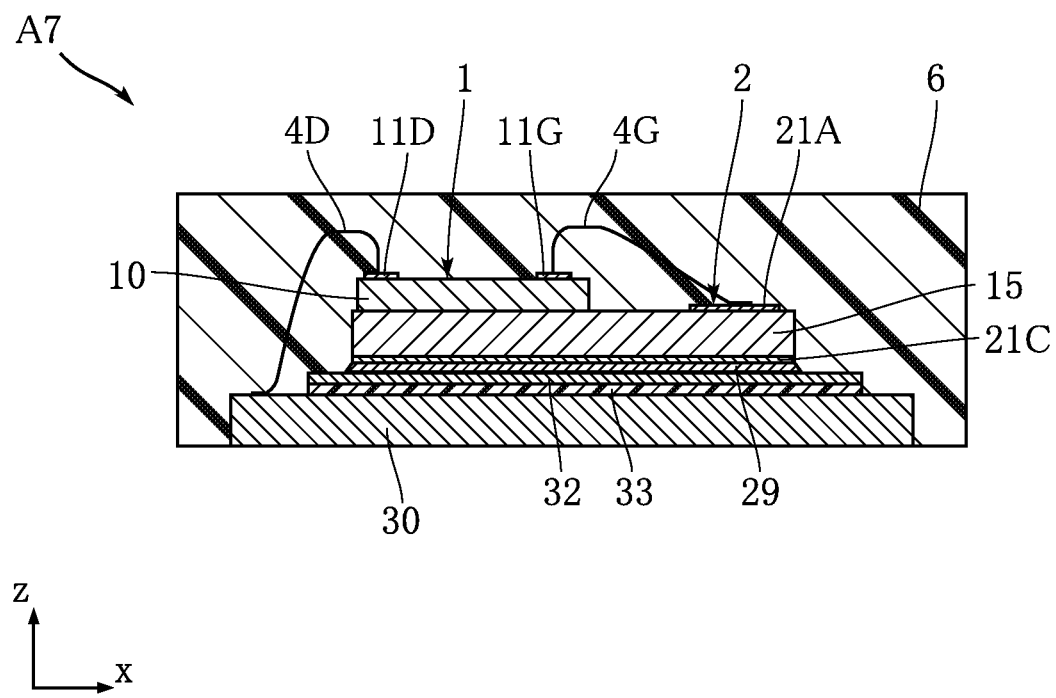
FIG. 31 is a cross-sectional view taken along a line XXXI-XXXI in FIG. 30.

FIG. 30 and FIG. 31 illustrate a semiconductor rectifier according to a seventh embodiment of the present disclosure. In the semiconductor rectifier A7 according to this embodiment, the transistor 1 and the diode 2 are unified with each other in what is known as a monolithic structure, and share a same semiconductor substrate 15. The semiconductor substrate 15 is, for example, formed of Si. On the respective faces of the semiconductor substrate 15, the anode electrode 21A and the cathode electrode 21C of the diode 2 are formed. The main body 10 is superposed on the semiconductor substrate 15. The electrical conduction arrangement among the transistor 1, the diode 2, and the lead frame 3 is similar to that of the semiconductor rectifier A1.

With the configuration according to this embodiment also, the withstand voltage can be improved, the threshold voltage can be lowered, and the reverse recovery time can be shortened. In addition, the size of the semiconductor rectifier A7 can be reduced.

The semiconductor rectifier according to the present disclosure is not limited to the foregoing embodiments. The specific configuration of the elements of the semiconductor rectifier according to the present disclosure may be modified in various manners.

The present disclosure also includes the embodiments defined in the following clauses.

Clause 1.

A semiconductor rectifier comprising:

a transistor including a source electrode, a drain electrode and a gate electrode; and a diode including an anode electrode and a cathode electrode, the anode electrode being electrically connected to the gate electrode, the cathode electrode being electrically connected to the source electrode.

Clause 2.

The semiconductor rectifier according to clause 1, wherein the transistor is a normally-on transistor.

Clause 3.

The semiconductor rectifier according to clause 1 or 2, further comprising a first resistor interposed in an electrical conduction path between the anode electrode and the gate electrode.

Clause 4.

The semiconductor rectifier according to clause 3, wherein the first resistor is formed as a unified body with at least one of the transistor and the diode.

Clause 5.

The semiconductor rectifier according to any one of clauses 1 to 4, further comprising a capacitor connected in parallel to the diode.

Clause 6.

The semiconductor rectifier according to clause 5, further comprising a second resistor connected in series to the capacitor.

Clause 7.

The semiconductor rectifier according to clause 6, wherein the second resistor is formed as a unified body with at least one of the transistor and the diode.

Clause 8.

The semiconductor rectifier according to any one of clauses 1 to 7, wherein the transistor includes a GaN semiconductor layer or a SiC semiconductor layer.

Clause 9.

The semiconductor rectifier according to any one of clauses 1 to 8, wherein the diode is a Si-Schottky barrier diode.

Clause 10.

The semiconductor rectifier according to any one of clauses 1 to 9, wherein the transistor is greater in withstand voltage than the diode.

Clause 11.

The semiconductor rectifier according to any one of clauses 1 to 10, wherein the transistor and the diode share a same semiconductor substrate.

Clause 12.

The semiconductor rectifier according to any one of clauses 1 to 11, wherein a threshold voltage of the diode is equal to or lower than 0.8 V.

Clause 13.

The semiconductor rectifier according to any one of clauses 1 to 12, wherein an electrostatic capacitance Cds between the drain electrode and the source electrode of the transistor, an electrostatic capacitance Cgs between the gate electrode and the source electrode, and an electrostatic capacitance Cdi of the diode satisfy a relation of:

$$2Cds \le Cdi+Cgs.$$

Clause 14.

The semiconductor rectifier according to any one of clauses 5 to 7, wherein an electrostatic capacitance Cds between the drain electrode and the source electrode of the transistor, an electrostatic capacitance Cgs between the gate electrode and the source electrode, an electrostatic capacitance Cdi of the diode 2, and an electrostatic capacitance Cxd of the capacitor satisfy a relation of:

$$2Cds \le Cdi+Cgs+Cxd.$$

Clause 15.

The semiconductor rectifier according to any one of clauses 1 to 14, wherein the transistor includes a GaN semiconductor layer, and the source electrode, the drain electrode, and the gate electrode are located on a same side.

Clause 16.

The semiconductor rectifier according to any one of clauses 1 to 14, wherein the transistor includes a SiC semiconductor layer, and the source electrode and the gate electrode are located on an opposite side of the drain electrode.

Clause 17.

The semiconductor rectifier according to any one of clauses 1 to 16, wherein the cathode electrode of the diode is conductively bonded to the source electrode of the transistor.

The invention claimed is:

1. A semiconductor rectifier comprising:
   a transistor including a source electrode, a drain electrode and a gate electrode,
      wherein the transistor includes a SiC semiconductor layer; and
   a diode including an anode electrode and a cathode electrode, the anode electrode being electrically connected to the gate electrode, the cathode electrode being electrically connected to the source electrode,
   wherein the transistor is greater in withstand voltage than the diode,
   wherein an electrostatic capacitance Cds between the drain electrode and the source electrode of the transistor, an electrostatic capacitance Cgs between the gate electrode and the source electrode, and an electrostatic capacitance Cdi of the diode satisfy a relation of:

$$2Cds \le Cdi+Cgs.$$

2. The semiconductor rectifier according to claim 1, wherein the transistor is a normally-on transistor.

3. The semiconductor rectifier according to claim 1, further comprising a first resistor interposed in an electrical conduction path between the anode electrode and the gate electrode.

4. The semiconductor rectifier according to claim 3, wherein the first resistor is formed as a unified body with at least one of the transistor and the diode.

5. The semiconductor rectifier according to claim 1, further comprising a capacitor connected in parallel to the diode.

6. The semiconductor rectifier according to claim 5, further comprising a second resistor connected in series to the capacitor.

7. The semiconductor rectifier according to claim 6, wherein the second resistor is formed as a unified body with at least one of the transistor and the diode.

8. The semiconductor rectifier according to claim 1, wherein the transistor includes a GaN semiconductor layer or a SiC semiconductor layer.

9. The semiconductor rectifier according to claim 1, wherein the diode is a Si-Schottky barrier diode.

10. The semiconductor rectifier according to claim 1, wherein the transistor and the diode share a same semiconductor substrate.

11. The semiconductor rectifier according to claim 1, wherein a threshold voltage of the diode is equal to or lower than 0.8 V.

12. The semiconductor rectifier according to claim 1, wherein the transistor includes a GaN semiconductor layer, and the source electrode, the drain electrode, and the gate electrode are located on a same side.

13. The semiconductor rectifier according to claim 1, wherein the source electrode and the gate electrode are located on an opposite side of the drain electrode.

14. The semiconductor rectifier according to claim 1, wherein the cathode electrode of the diode is conductively bonded to the source electrode of the transistor.

15. A semiconductor rectifier comprising:
   a transistor including a source electrode, a drain electrode and a gate electrode,
      wherein the transistor includes a SiC semiconductor layer; and
   a diode including an anode electrode and a cathode electrode, the anode electrode being electrically connected to the gate electrode, the cathode electrode being electrically connected to the source electrode, wherein the transistor is greater in withstand voltage than the diode, wherein an electrostatic capacitance Cds between the drain electrode and the source electrode of the transistor, an electrostatic capacitance Cgs between the gate electrode and the source electrode, an electrostatic capacitance Cxd of the capacitor, and an electrostatic capacitance Cdi of the diode satisfy a relation of:

$$2Cds \leq Cdi + Cgs + Cxd.$$

* * * * *